United States Patent
Wada et al.

(10) Patent No.: US 6,787,692 B2
(45) Date of Patent: Sep. 7, 2004

(54) SOLAR CELL SUBSTRATE, THIN-FILM SOLAR CELL, AND MULTI-JUNCTION THIN-FILM SOLAR CELL

(75) Inventors: Kenji Wada, Osaka (JP); Yoshiyuki Nasuno, Osaka (JP); Michio Kondo, 4-424-104, Matsushiro, Tsukuba-shi Ibaraki 305-0035 (JP); Akihisa Matsuda, 3-2-8, Nishineminami, Tsuchiura-shi Ibaraki 300-0842 (JP)

(73) Assignees: National Institute of Advanced Industrial Science & Technology, Tokyo (JP); Sharp Kabushiki Kaisha, Osaka (JP); Akihisa Matsuda, Tsuchiura (JP); Michio Kondo, Tsukuba (JP)

( * ) Notice: Subject to any disclaimer, the term of this patent is extended or adjusted under 35 U.S.C. 154(b) by 0 days.

(21) Appl. No.: 09/984,905

(22) Filed: Oct. 31, 2001

(65) Prior Publication Data

US 2002/0050289 A1 May 2, 2002

(30) Foreign Application Priority Data

| Oct. 31, 2000 | (JP) | 2000-333701 |
| Oct. 31, 2000 | (JP) | 2000-333713 |
| Oct. 31, 2000 | (JP) | 2000-333718 |

(51) Int. Cl.$^7$ .......................................... H01L 31/052
(52) U.S. Cl. .................. 136/256; 136/246; 136/259; 136/249; 136/244; 136/261; 136/255; 257/436; 257/458; 257/434; 428/702; 428/332
(58) Field of Search ................ 136/256, 246, 136/259, 249, 244, 261, 255; 257/436, 458, 434; 428/702, 332

(56) References Cited

U.S. PATENT DOCUMENTS

| 4,694,116 | A | | 9/1987 | Hayashi et al. |
| 5,589,008 | A | | 12/1996 | Keppner |
| 5,977,477 | A | * | 11/1999 | Shiozaki ............ 136/256 |
| 6,072,117 | A | | 6/2000 | Matsuyama et al. |
| 6,211,454 | B1 | | 4/2001 | Sano |
| 6,459,034 | B2 | | 10/2002 | Muramoto et al. |
| 6,465,727 | B2 | | 10/2002 | Maruyama et al. |
| 6,512,170 | B1 | * | 1/2003 | Hirata et al. ............ 136/256 |
| 6,593,522 | B2 | * | 7/2003 | Nakano et al. .......... 136/256 |
| 2002/0050289 | A1 | | 5/2002 | Wada et al. |
| 2002/0134425 | A1 | | 9/2002 | Yamamoto et al. |

FOREIGN PATENT DOCUMENTS

| EP | 0 893 833 A2 | 1/1999 |
| JP | 10-070294 A | 3/1998 |

* cited by examiner

*Primary Examiner*—Alan Diamond
(74) *Attorney, Agent, or Firm*—Birch, Stewart, Kolasch & Birch, LLP

(57) ABSTRACT

A solar cell substrate has irregularities on a surface which is in contact with a photo-electric conversion layer, and light is incident on the side of the irregularities. The height of the irregularities is set so that the root mean square height is in a range of 15 nm to 600 nm, and tan θ is in a range of 0.10 to 0.30, where θ is the angle of incline of the surface of the irregularities with respect to an average line of the irregularities. Light incident on the irregularities is scattered at the interface. This increases the optical path length and thus the quantity of light absorbed in the photo-electric conversion layer, resulting in improved efficiency. Additionally, the photo-electric conversion layer can be made thinner reducing deposit time and manufacturing cost. Further, collision of crystals is not incurred, thus preventing deterioration of photo-electric conversion efficiency which is caused by defects.

35 Claims, 3 Drawing Sheets

SOLAR CELL SUBSTRATE, THIN-FILM SOLAR CELL, AND MULTI-JUNCTION THIN-FILM SOLAR CELL

FIELD OF THE INVENTION

The present invention relates to a solar cell substrate, thin-film solar cell, and multi-junction thin-film solar cell, which are capable of inexpensively providing solar cells having stable and high photo-electric conversion efficiency.

BACKGROUND OF THE INVENTION

Fossil fuel such as petroleum is expected to be in short of supply in the future, and has the problem of carbon dioxide emission, in addition to causing the global warming effect. In recent years, solar cells have been under the focus of attention as a replacement energy source for fossil fuel such as petroleum.

The solar cells incorporate semiconductors with the p-n junction in a photo-electric conversion layer which converts light energy into electricity. The most common semiconductor with the p-n junction is silicon. In view of photo-electric conversion efficiency, mono-crystalline silicon is preferably used for the semiconductor. However, semiconductors with mono-crystalline silicon have problems in that it is difficult to supply the raw material, to increase its area, and to reduce cost.

Meanwhile, a thin-film solar cell which incorporates amorphous silicon as the photo-electric conversion layer has been put in practical applications to increase area and reduce cost. Further, use of crystalline silicon as the photo-electric conversion layer has been investigated in an effort to realize a solar cell with high and stable photo-electric conversion efficiency which can match up against that of the mono-crystalline silicon solar cell, and with a large area and low cost comparative to that attained by the amorphous silicon solar cell. A particular interest has been on a thin-film solar cell with a crystalline silicon thin film ("crystalline silicon thin-film solar cell" hereinafter), which is formed by the thin-film deposition technique employing the chemical vapor deposition method ("CVD method" hereinafter) which is used in forming the amorphous silicon.

Japanese Unexamined Patent Publication No. 289173/1989 (Tokukaihei 1-289173) (published date: Nov. 21, 1989) discloses a multi-junction thin-film solar cell which is formed by depositing a photo-electric conversion element having an amorphous silicon active layer as an active layer, and another photo-electric conversion element having an active layer of crystalline silicon which has a comparatively smaller energy gap than the amorphous silicon. This multi-junction thin-film solar cell is structured so that sun light is incident on the side of the photo-electric conversion element having the active layer of amorphous silicon, which is advantageous in utilizing the solar energy more efficiently than the mono-junction type. Further advantages of this structure are high open-circuit voltage due to the series connection of the plurality of photo-electric conversion elements, and slow degradation rate of photo-electric conversion efficiency which degrades due to the Staebler-Wronski effect. This slow degradation rate of photo-electric conversion efficiency is made possible by the thin amorphous silicon layer as the active layer. Another advantage of this structure is that it allows the amorphous silicon layer and the crystalline silicon layer to be fabricated using the same device, which has made this structure a target of active research and development to attain high efficiency and low cost at the same time.

Note that, in the following description of the present invention, the term "crystalline" is meant to indicate not only a crystalline state of essentially pure crystals such as "mono-crystal" or "poly-crystal", but also a mixed state of crystal component and amorphous component, which state is referred to as "microcrystal".

One of the important techniques which is an important factor in realizing a thin-film solar cell with high photo-electric conversion efficiency is light-trapping. The light-trapping is the phenomenon in which the quantity of light absorbed in the photo-electric conversion layer is increased by increasing the optical path length, which is attained by forming irregularities on the surface of the transparent conductive film or metal layer in contact with the photo-electric conversion layer, so as to cause light to scatter at the interface.

For example, Japanese Patent No. 1681183 (published date: Apr. 6, 1983) and No. 2862174 (issued Feb. 24, 1999) disclose solar cell substrates which specify particle size or size of irregularities of the transparent conductive film which is formed on the glass substrate.

The improved photo-electric conversion efficiency by the light-trapping effect enables the photo-electric conversion layer to have a thinner thickness. This effect suppresses deterioration of light caused by the Staebler-Wronski effect, in the case of the amorphous silicon solar cell.

Further, due to its light absorbing characteristics, the crystalline silicon solar cell conventionally required a thickness on the order of several microns, which is several times to several ten times greater than that required for the amorphous silicon. However, even with the crystalline silicon solar cell, a deposit time can be made much shorter when the photo-electric conversion efficiency is improved by the effect of light-trapping.

That is, light-trapping is the essential technique for realizing high efficiency, high stability, and low cost at the same time, which are all required for practical applications of the thin-film solar cell.

However, despite active research and development to this date, the photo-electric conversion efficiency of the conventional crystalline silicon thin-film solar cells has only reached the level of the photo-electric conversion efficiency of the amorphous silicon.

Technical Digest of the International PVSEC-11, Sapporo, Hokkaido, Japan, 1999 (H. Yamamoto et al.) has the following report.

Microcrystalline silicon, when deposited by the plasma CVD method on the Asahi-U substrate, which is a glass substrate with tin oxide deposited thereon to have microscopic irregularities, causes crystal grains of the silicon to grow primarily in a vertical direction with respect to each surface of the microscopic irregularities of tin oxide. The crystal grains grown in this manner from each different surface of the irregularities have different crystal directions and they collide with one another. The result is mass defects. These defects need to be suppressed to a minimum because they become a recombination center of carriers (electrons and holes) to severely degrade photo-electric conversion efficiency.

H. Yamamoto et al. has the following report as well.

The size of the irregularities was made smaller by depositing zinc oxide to a thicker thickness on the tin oxide having surface irregularities. The result was the same as that obtained using only tin oxide, causing growth of crystal grains of the silicon in a vertical direction with respect to the surface of zinc oxide and thereby causing collision of crystal grains which grow from each different surface. However, the differences of directions were smaller in this case, and less defects were incurred.

It is therefore apparent that the size of irregularities on the substrate surface should be reduced as much as possible in order to reduce defects in the crystalline silicon thin-film. While this may be the case, as noted above, light-trapping is necessary for the thin-film solar cell, and it is not entirely preferable to eliminate or reduce the surface irregularities when practical applications are at hand.

Meanwhile, the solar cell substrate with the transparent conductive film having surface irregularities, as disclosed in the foregoing Japanese Patent No. 1681183 and No. 2862174, has the problem of cost, which is one factor that prevents wide-spread use of the thin-film solar cell. One approach to solve this problem is to use zinc oxide for the transparent conductive layer. Zinc oxide is comparatively cheaper than other materials such as tin oxide or ITO which are widely used as the material of the transparent conductive film. Further, the advantage of high plasma resistance makes zinc oxide a suitable material for the transparent conductive film used for thin-film solar cells.

Examples of using zinc oxide for the transparent conductive film of the thin-film solar cell are disclosed in Japanese Patent No. 2974485 (issued Nov. 10, 1999), No. 3072832 (issued Aug. 7, 2000), and Japanese Unexamined Patent Publication No. 233800/1999 (Tokukaihei 11-233800) (published date: Aug. 27, 1999). These publications disclose thin-film solar cells with irregularities which are formed by etching a zinc oxide layer which was deposited by sputtering. However, these are all examples of optimization of amorphous silicon solar cells, and they require other modifications to be applicable to crystalline silicon thin-film solar cells. Specifically, there has been no known structure of surface irregularities of the substrate which can exhibit high light-trapping effect without causing defects in the photo-electric conversion layer.

Further, Japanese Unexamined Patent Publication No. 117006/1998 (Tokukaihei 10-117006) (published date: May 6, 1998), No. 294481/1998 (Tokukaihei 10-294481) (published date: Nov. 4, 1998), No. 214728/1999 (Tokukaihei 11-214728) (published date: Aug. 6, 1999), and No. 266027/1999 (Tokukaihei 11-266027) (published date: Sept. 28, 1999), No. 58892/2000 (Tokukai 2000-58892) disclose structures of thin-film solar cells and multi-junction thin-film solar cells.

Specifically, the solar cells disclosed in these publications have a structure in which a lower photo-electric conversion element having a photo-electric conversion layer of crystalline silicon layer is formed on a rear electrode having surface irregularities, and the foregoing publications disclose a structure of a thin-film solar cell in which the crystalline silicon layer has a primary crystal orientation plane (110) parallel to the substrate surface.

However, the structures disclosed in these publications all have an element structure of a substrate type in which light is incident on the side of the photo-electric conversion element, and even in the element structure of a superstrate type in which light is incident on the side of the substrate using a transparent substrate, there has been no known irregular structure which can be suitably used to realize low defect density and good light-trapping effect at the same time in the crystalline silicon thin-film.

SUMMARY OF THE INVENTION

It is an object of the present invention to provide a solar cell substrate which can be manufactured at low cost with sufficient light-trapping effect without increasing defect density in a crystalline semiconductor layer, and a thin-film solar cell, and a multi-junction thin-film solar cell.

In order to achieve this object, a solar cell substrate of the present invention has irregularities on the surface which is in contact with a photo-electric conversion layer, light being incident on the solar cell substrate on the side of the irregularities, wherein: a height of the irregularities is set so that a root mean square height is in a range of 15 nm to 600 nm, and tan $\theta$ is in a range of 0.10 to 0.30, where $\theta$ is an angle of incline of a surface of the irregularities with respect to an average line of the irregularities.

According to this arrangement, since the irregularities on the surface of the solar cell substrate are in contact with the photo-electric conversion layer, the light incident toward the irregularities is scattered at the interface. The scattering of light increases the optical path length, and thus the quantity of light absorbed in the photo-electric conversion layer. By this trapping of light, photo-electric conversion efficiency is increased. The improved photo-electric conversion efficiency enables the photo-electric conversion layer to have a thinner thickness. As a result, much less deposit time and much less manufacturing cost are required for the photo-electric conversion layer.

Incidentally, depending on such factors as the height or shape of the irregularities on the surface of the solar cell substrate, there are cases where crystal grains of a crystalline semiconductor which is formed as the photo-electric conversion layer on the irregular surface collide. This causes defects. Such defects become a recombination center of carriers and have detrimental effect on photo-conversion efficiency.

In view of this, according to the present invention, the height of the irregularities is set so that the root mean square height of the irregularities is in a range of 15 nm to 600 nm, and tan $\theta$ is in a range of 0.10 to 0.30, where $\theta$ is the angle of incline of the irregular surface with respect to an average line of the irregularities. This arrangement greatly reduces occurrence of crystal collisions without losing light-trapping effect. In effect, it is ensured that photo-electric conversion efficiency does not become poor due to defects.

Further, in order to achieve the foregoing object, a thin-film solar cell according to the present invention includes: a solar cell substrate having irregularities on a surface which is in contact with a photo-electric conversion layer, light being incident on the solar cell substrate on the side of the irregularities, a height of the irregularities being set so that a root mean square height is in a range of 15 nm to 600 nm, and tan $\theta$ in a range of 0.10 to 0.30, where $\theta$ is an angle of incline of a surface of the irregularities with respect to an average line of the irregularities, the solar cell substrate having the photo-electric conversion layer which is made up of at least one photo-electric conversion element.

According to this arrangement, the absorbed quantity of light by the light-trapping effect can be increased without causing more defects in the photo-electric conversion layer, thereby providing the solar cell substrate with stable and high photo-electric conversion efficiency at low cost.

Further, in order to achieve the foregoing object, a solar cell substrate of the present invention has irregularities on a surface which is in contact with a photo-electric conversion layer, light being incident on the solar cell substrate on the other side of the irregularities, wherein: a height of the irregularities is set so that a root mean square height is in a range of 25 nm to 600 nm, and tan $\theta$ is in a range of 0.07 to 0.20, where $\theta$ is an angle of incline of a surface of the irregularities with respect to an average line of the irregularities.

According to this arrangement, since the irregularities on the surface of the solar cell substrate are in contact with the photo-electric conversion layer, the light incident toward the irregularities is scattered at the interface. The scattering of light increases the optical path length, and thus the quantity of light absorbed in the photo-electric conversion layer. By this trapping of light, photo-electric conversion efficiency is improved. The improved photo-electric conversion efficiency enables the photo-electric conversion layer to have a thinner thickness. As a result, much less deposit time and much less manufacturing cost are required for the photo-electric conversion layer.

Incidentally, depending on such factors as the height or shape of the irregularities on the surface of the solar cell substrate, there are cases where crystal grains of a crystalline semiconductor which is formed as the photo-electric conversion layer on the irregular surface collide. This causes defects. Such defects become a recombination center of carriers and have detrimental effect on photo-conversion efficiency.

In view of this, according to the present invention, the height of the irregularities is set so that the root mean square height of the irregularities is in a range of 25 nm to 600 nm, and tan θ is in a range of 0.07 to 0.20, where θ is the angle of incline of the irregular surface with respect to an average line of the irregularities. This arrangement greatly reduces occurrence of crystal collisions without losing light-trapping effect. In effect, it is ensured that photo-electric conversion efficiency does not become poor due to defects.

Further, in order to achieve the foregoing object, a thin-film solar cell according to the present invention includes: a solar cell substrate having irregularities on a surface which is in contact with a photo-electric conversion layer, light being incident on the solar cell substrate on the side of a surface opposite the surface with the irregularities, a height of the irregularities being set so that a root mean square height is in a range of 25 nm to 600 nm, and tan θ in a range of 0.07 to 0.20, where θ is an angle of incline of a surface of the irregularities with respect to an average line of the irregularities, the solar cell substrate having the photo-electric conversion layer which is made up of at least one photo-electric conversion element.

According to this arrangement, the absorbed quantity of light by the light-trapping effect can be increased without causing more defects in the photo-electric conversion layer, thereby providing the solar cell substrate with stable and high photo-electric conversion efficiency at low cost.

Further, in order to achieve the foregoing object, a multi-junction thin-film solar cell of the present invention includes: a plurality of photo-electric conversion elements on the opposite side of a side of a substrate on which light is incident; and an intermediate layer, having irregular surfaces, provided on at least one of the photo-electric conversion elements adjacent to one another, a height of the irregularities of the intermediate layer being set so that a root mean square height is in a range of 25 nm to 600 nm, and tan θ in a range of 0.07 to 0.20, where θ is an angle of incline of a surface of the irregularities with respect to an average line of the irregularities.

According to this arrangement, the intermediate layer is provided between adjacent photo-electric conversion elements. Directly connecting adjacent photo-electric conversion elements means connecting layers of different conduction types. This causes deficiencies such as connection failure by the mixing of impurities which are generated by the connection of the opposite direction. The intermediate layer is provided to prevent such deficiencies.

The intermediate layer has irregularities at least on the surface on the other side of the surface facing the substrate. Light is scattered at the interface of the irregular surface of the intermediate layer, and the photo-electric conversion layer. The scattering of light increases the optical path length and thus the quantity of light absorbed in the photo-electric conversion layer. By this trapping of light, photo-electric conversion efficiency is improved. The improved photo-electric conversion efficiency enables the photo-electric conversion layer to have a thinner thickness. As a result, much less deposit time and much less manufacturing cost are required for the photo-electric conversion layer.

For a fuller understanding of the nature and advantages of the invention, reference should be made to the ensuing detailed description taken in conjunction with the accompanying drawings.

DESCRIPTION OF THE EMBODIMENTS

First Embodiment

Figure 1:
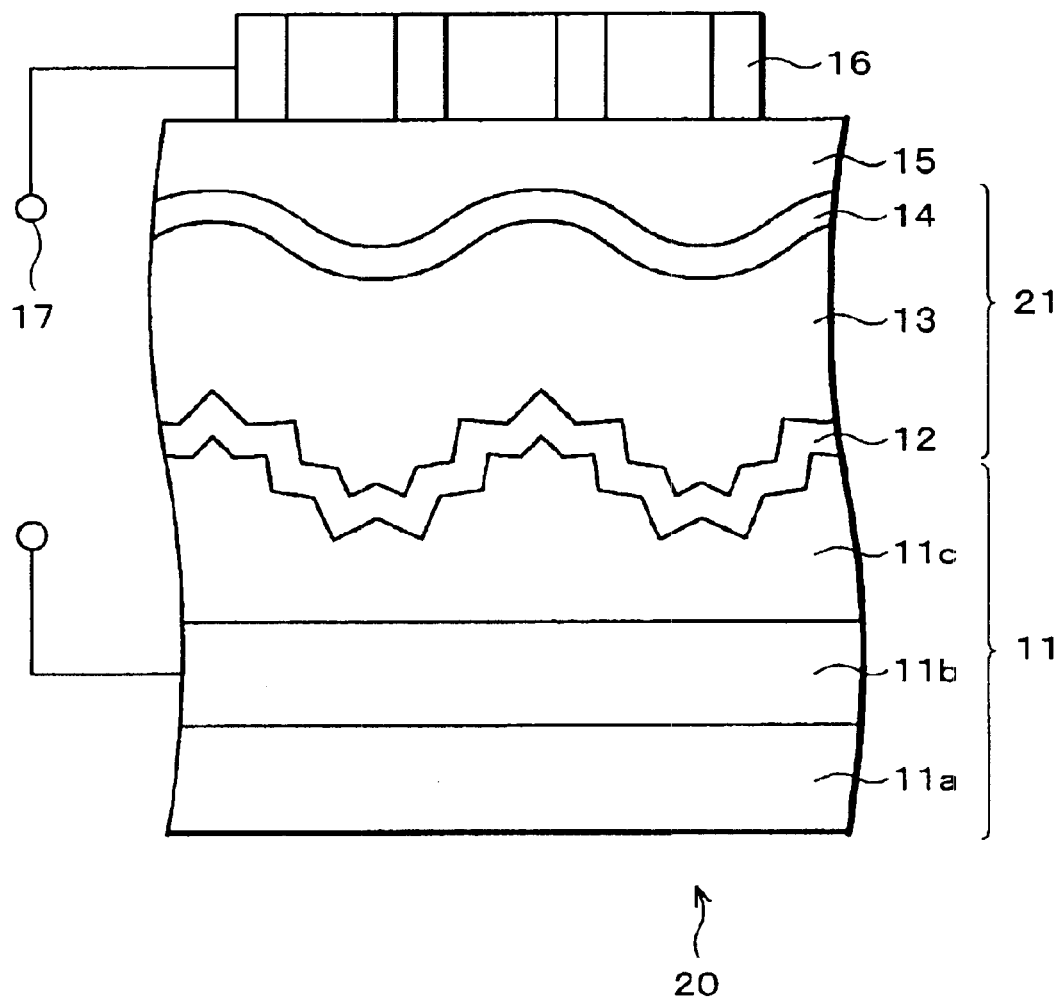
FIG. 1 is a cross sectional view showing a thin-film solar cell according to one embodiment of the present invention.

The following will describe one embodiment of the thin-film solar cell of the present invention with reference to FIG. 1.

As shown in FIG. 1, a thin-film solar cell 20 of the present invention includes a glass substrate 11a, a rear electrode 11b, an irregular surface layer 11c, an n-type crystalline silicon layer 12, an i-type crystalline silicon layer 13, a p-type silicon layer 14, a transparent electrode 15, and a front electrode 16, which are deposited in this order from the bottom.

The thin-film solar cell 20 is of a so-called substrate type in which light is incident on the side of the front electrode 16.

The glass substrate 11a, the rear electrode 11b, and the irregular surface layer 11c make up a solar cell substrate 11.

The glass substrate 11a, which is a component of the solar cell substrate 11, has a thickness, for example, in a range of about 0.1 mm to 30 mm, but not particularly limited thereto, so that it has a strength or mass which is sufficient to support the structure.

The glass substrate 11a is made of glass in the present embodiment, but other materials, such as metal, or resin with a heat resisting property as high as about 200° C., such as polyimide or polyvinyl, or a combination of metal and such resin stacked together can be used. Further, a surface of the substrate made of these materials may be coated with a metal film, a transparent conductive film, or an insulating film, etc.

The rear electrode 11b can incorporate metal having high reflectance for visible light, for example, such as Ag (silver), Al (aluminium), Ti (titanium), and Pd (palladium), etc., or an alloy of these metals. This renders the rear electrode 11b, in addition to the function of an electrode, the function of reflecting those components of incident light which were not converted to electricity and leaked from a photo-electric conversion layer 21 back to the photo-electric conversion layer 21. This additional function can improve photo-electric conversion efficiency. Note that, when the substrate itself is made of metal, the substrate serves as the rear electrode and the rear electrode 11b may be omitted in this case.

The irregular surface layer 11c is made of a transparent conductive material, and it is formed by etching zinc oxide, which is a transparent conductive material.

Forming the transparent conductive film on the solar cell substrate 11 by forming irregularities thereon by etching is advantageous because it allows the surface pattern of the transparent conductive film to be easily controlled by suitably changing types of etchant, or concentration or time of etching. This makes it easier to form irregularities within a defined range which is determined by the root mean square height of the irregularities, and tan θ.

Note that, the solar cell substrate 11 can be manufactured less expensively than conventionally by using an acid or alkaline solution as the etchant. Examples of acid solution which can be used include solutions of hydrochloric acid, sulfuric acid, nitric acid, hydrofluoric acid, acetic acid, formic acid, and perchloric acid, which may be used individually or as a mixture of two or more kinds, among which hydrochloric acid and acetic acid are particularly preferable. These acid solutions can be used in a concentration, for example, in a range of about 0.05 weight % to 5.0 weight %, or, in the case of relatively weak acids such as acetic acid in particular, in a range of about 0.1 weight % to 5.0 weight %. Further, examples of alkaline solution which can be used include solutions of sodium hydroxide, ammonia, potassium hydroxide, calcium hydroxide, and aluminium hydroxide, which may be used individually or as a mixture of two or more kinds, among which sodium hydroxide is particularly preferable. These alkaline solutions can be used in a concentration, for example, in a range of about 1 weight % to 10 weight %.

Further, the use of transparent conductive material for the irregular surface layer 11c causes the incident light on the thin-film solar cell 20 to scatter at the interface of the irregular surface layer 11c and the photo-electric conversion layer 21. This increases the optical path length of light and thereby improves the light-trapping effect. As a result, photo-electric conversion efficiency is improved, thus reducing the thickness of the photo-electric conversion layer 21.

This makes it possible to reduce the thickness of the thin-film solar cell 20 made of crystalline silicon, thereby greatly reducing deposit time. Further, impurities contained in the solar cell substrate 11 can be prevented from entering the photo-electric conversion layer 21 when forming the photo-electric conversion layer 21.

Further, it is preferable that the transparent conductive material used to form the irregular surface layer 11c is chiefly zinc oxide. Zinc oxide has such characteristics that it can be provided inexpensively and it is hardly modified due to its high plasma resistance. This makes it possible to obtain the solar cell substrate 11 with high plasma resistance at low cost, compared with the case using such materials as tin oxide, indium oxide, or ITO, which have been widely used as the material of the transparent conductive film.

Note that, the transparent conductive material may include a trace amount of impurities. For example, when the main component is zinc oxide, elements which belong to Group IIIB of the periodic table, such as gallium or aluminium, or Group IB of the periodic table, such as copper may be included in an amount of about $5 \times 10^{20}$ cm$^{-3}$ to $5 \times 10^{21}$ cm$^{-3}$. This addition of impurities lowers a resistivity of the irregular surface layer 11c, and therefore is suitable when it is used as an electrode.

The thickness of the transparent conductive film, when it is too thin, may result in uneven characteristics as the solar cell. On the other hand, when it is too thick, transmittance and thus photo-electric conversion efficiency is reduced, which increases the deposit time and thus the cost. In view of these drawbacks, a thickness in a range of about 0.1 μm to 2.0 μm is preferable.

The transparent conductive film can be made by known-methods, for example, such as the sputtering method, atmospheric CVD method, low pressure CVD method, electron beam vapor deposition method, sol-gel method, and electrodeposition method. Among these methods, the sputtering method is particularly preferable because it makes it easier to control transmittance or resistivity of the irregular surface layer 11c within a suitable range for the thin-film solar cell 20.

Here, the root mean square height of the irregularities, and tan θ are used as indices which indicate the irregularities on the surface of the irregular surface layer 11c, where θ is the angle of incline of the irregular surface with respect to an average line of the irregularities. These indices are set so that the root mean square of the irregular surface layer 11c of the present embodiment is in a range of 15 nm to 600 nm, and tan θ is in a range of 0.10 to 0.30.

By thus forming the irregular surface layer 11c using the indices in these ranges, the irregularities on the surface of the solar cell substrate 11 are in contact with the photo-electric conversion layer 21. This scatters light at the interface, which increases the optical path length and thus the quantity of light absorbed in the photo-electric conversion layer 21. By this trapping effect of light, photo-electric conversion efficiency can be improved. The improved photo-electric conversion efficiency enables the photo-electric conversion layer 21 to have a thinner thickness, thereby greatly reducing deposit time and manufacturing cost required for the photo-electric conversion layer 21.

Further, according to the foregoing arrangement, since the root mean square is set in a range of 15 nm to 600 nm, and tan θ in a range of 0.10 to 0.30, the occurrence of crystal collision in the photo-electric conversion layer 21 can be greatly reduced. As a result, it is ensured that photo-electric conversion efficiency does not suffer due to defects.

In other words, the irregular layer surface 11c can sufficiently have light-trapping effect by providing the solar cell substrate 11 with at least a single layer of irregular surface layer 11c, and by setting the root mean square at 15 nm or larger and tan θ at 0.10 or larger. Further, by setting the root mean square at or below 600 nm, and tan θ at or below 0.30, the height of the irregularities and the differences of directions become suitable, and thus defects of the irregularities can be suppressed even when crystal grains of silicon formed on the irregular surface layer 11c collide.

Further, effects of the present invention can be more suitably obtained by setting the root mean square height of the irregularities within a range of 20 nm to 400 nm, and tan θ in a range of 0.15 to 0.25. By forming irregularities with the root mean square and tan θ in these ranges, it is further ensured that the irregular surface layer 11c has less defects and improved light-trapping effect.

Further, portions of the irregularities on the surface of the solar cell substrate 11 has indentations which are more gradual than the irregularities on the surface of the solar cell substrate 11. The indentations are in the form of a near hemisphere or circular cone with a diameter of 200 nm to 2000 nm.

With these indentations, the irregular surface layer 11c having irregularities can be formed with good reproducibility in the foregoing ranges of root mean square and tan θ. As a result, light-trapping effect improves and the solar cell substrate 11 having high photo-electric conversion efficiency can be obtained.

Note that, the present invention can be implemented more effectively by forming the indentations with a diameter in a range of 400 nm to 1200 nm, because it further improves light-trapping effect and forms the irregular surface layer 11c with even less defects.

The present embodiment employs etching to form the irregular surface layer 11c. However, other than etching, for example, a film may be deposited on a flat surface of the glass substrate 11a so that irregularities are formed thereon as soon as the film is deposited. The material of the film used to form the irregular surface layer 11c may be the same as or different from that of the solar cell substrate 11. Further, the irregular surface layer 11c may be formed by mechanical means such as sand blast on the surface of the solar cell substrate 11.

Further, the photo-electric conversion layer 21 for converting incident light into electricity (i.e., so-called photo-electric conversion) includes the n-type crystalline silicon layer 12, i-type crystalline silicon layer 13, and p-type silicon layer 14.

The photo-electric conversion layer 21 has an irregular surface. The irregularities, which are provided by the i-type crystalline silicon layer 13, are formed under the following conditions, and the p-type silicon layer 14 is deposited thereon. Note that, since the p-type silicon layer 14 is thin, it can be regarded as approximation of the irregularities of the i-type crystalline silicon layer 13. The irregularities are formed at the root mean square height of irregularities in a range of 25 nm to 600 nm, and tan θ in a range of 0.07 to 0.20.

Thus, irregularities are suitably formed on the both surfaces of the photo-electric conversion layer 21 and thereby adding irregularities which are formed under different conditions from the irregular surface layer 11c. As a result, the light-trapping effect can be sufficiently obtained both in the middle wavelength range of 450 nm to 650 nm and a longer wavelength range of the solar spectrum.

The irregularities may be formed on the surface of the i-type crystalline silicon layer 13 under the foregoing conditions, for example, by forming the photo-electric conversion layer 21 in such a manner that irregularities are formed as soon as the semiconductor layers (n-type crystalline silicon layer 12, i-type crystalline silicon layer 13, and p-type silicon layer 14) of the photo-electric conversion layer 21 are deposited. Here, the conditions of forming the irregularities on the surface of the photo-electric conversion layer 21 are decided by taking into consideration the influence of the irregularities on the surface of the irregular surface layer 11c of the solar-cell substrate 11. The irregularities may be formed on the i-type crystalline silicon layer 13 also by mechanical means such as sand blast, or chemical means such as etching on the surface of the photo-electric conversion layer 21.

The transparent electrode 15 is a thin-film electrode made of ITO, 50 nm thick, which is formed by the magnetron sputtering method.

The front electrode 16 is formed by shaping silver into a comb shape by the electron beam vapor deposition method, wherein electrodes 17 are drawn out from the front electrode 16 and the rear electrode 11b, so as to make up the thin-film solar cell 20 of a substrate type.

According to the foregoing arrangement, it is possible to provide the solar cell substrate 11 with high photo-electric conversion efficiency by the effect of light-trapping, together with the photo-electric conversion layer 21 which causes less defects on the irregularities of the irregular surface layer 11c which is provided to improve photo-electric conversion efficiency. Further, with the use of the solar cell substrate 11, the thin-film solar cell 20 can be provided with high photo-electric conversion efficiency at low cost.

Note that, the present embodiment described the case where the photo-electric conversion layer 21 is made up of a single photo-electric conversion element. However, the photo-electric conversion layer 21 may be provided with a plurality of photo-electric conversion elements, in which the active layer (I-type layer) of at least one of these photo-electric conversion elements is made of crystalline silicon or silicon alloy. This allows the use of light with a longer wavelength of 700 nm or longer, which cannot be used in the photo-electric conversion by amorphous silicon.

Note that, examples of silicon alloy include, for example, $Si_xSn_{1-x}$, which is a mixture of silicon and tin, and $Si_xGe_{1-x}$, which is a mixture of silicon and germanium.

The following describes effects of the present invention more specifically based on Examples 1 through 3, Comparative Example 1, and Conventional Example 1.

EXAMPLE 1

The following explains procedures of fabricating the solar cell substrate 11 and the thin-film solar cell 20 with reference to FIG. 1. Note that, constituting elements having the same functions as those described with reference to the drawing in the foregoing descriptions of the embodiment are given the same reference numerals and explanations thereof are omitted here.

By the electron beam vapor deposition method, the rear electrode 11b made of silver was formed in the thickness of 500 nm on a flat surface of the glass substrate 11a while the temperature of the glass substrate 11a was at 150° C. Then, the magnetron sputtering method was used to deposit zinc oxide in the thickness of 500 nm on the rear electrode 11b while the temperature of the glass substrate 11a was at 150° C. The zinc oxide contained gallium in the amount of about $1 \times 10^{21}$ cm$^{-3}$.

As a result, the zinc oxide had a sheet resistivity of 10Ω/□ and a transmittance of 80% with respect to light of a wavelength at 800 nm.

Thereafter, the zinc oxide was etched. The glass substrate 11a coated with the zinc oxide was immersed in 0.5 weight % of a hydrochloric acid aqueous solution at the liquid temperature of 25° C. for 30 seconds, and then the surface of the glass substrate 11a was rinsed thoroughly with pure water to obtain the irregular surface layer 11c. Observing surface patterns of the irregular surface layer 11c using a scanning electron microscope, a large number of indentations of a near hemisphere with the surface diameter of 200 nm to 1400 nm were found.

In order to examine the surface patterns of the irregular surface layer 11c in more detail, an atomic force microscope was used to measure the surface patterns. From the shape of the indentations in a direction of depth, the shape of the indentations was found to be a near hemisphere or a circular cone. In order to express the profile of the surface patterns in numerical values, the root mean square (RMS) height of the irregularities was used as the index which indicates the height of the irregularities. Further, most frequent wavelength W of a sinusoidal curve which is obtained by Fourier conversion of a curve of the surface pattern waveform was used as the index which indicates the pitch of irregularities, and the slope of the irregular surface with respect to an average line of the surface irregularities was denoted as θ. This gave tan θ=2RMS/(W/2)=4RMS/W, whereby the root mean square and tan θ were used as the indices of the profile of the irregularities. In this example, the root mean square was 23 nm and tan θ was 0.13.

On the solar cell substrate 11 so obtained, the n-type crystalline silicon layer 12, the i-type crystalline silicon layer 13, and the p-type silicon layer 14 were deposited in this order by the plasma CVD method at the high frequency of 13.56 MHz.

The n-type crystalline silicon layer 12 was deposited in the thickness of 30 nm under the following conditions: 1 SCCM of $SiH_4$ gas; 100 SCCM of $PH_3$ gas which was adjusted to 1000 ppm using $H_2$ gas; a pressure of a deposit room at 27 Pa; discharge power of 30 W; and a substrate temperature of 180° C.

The i-type crystalline silicon layer 13 was deposited in the thickness of 2500 nm under the following conditions: 11 SCCM of $SiH_4$ gas; 350 SCCM of $H_2$ gas; a pressure of a deposit room at 200 Pa; discharge power of 20 W; and a substrate temperature of 140° C.

The p-type silicon layer 14 was deposited in the thickness of 30 nm under the following conditions: 3 SCCM of $SiH_4$ gas; 600 SCCM of $H_2$ gas; 1 SCCM of $B_2H_6$ gas which was adjusted to 5000 ppm using $H_2$ gas; a pressure of a deposit room at 200 Pa; discharge power of 25 W; and a substrate temperature of 140° C.

The whole was then taken out of the plasma CVD device (not shown) and surface patterns of the p-type silicon layer 14 were observed using the atomic force microscope. The measurement showed that the root mean square height of the irregularities was 18 nm, and tan θ was 0.06.

Further, the surface of the p-type silicon layer 14 was examined by the X-ray diffraction method, which showed that the ratio $I_{220}/I_{111}$ of integral intensity $I_{220}$ at the X-ray diffraction peak of 220 to integral intensity $I_{111}$ at the X-ray diffraction peak of 111 was 3.0. Here, the peaks of X-ray diffraction are not derived from the i-type crystalline silicon layer 13 itself. However, since the thicknesses of the p-type silicon layer 14 and the n-type crystalline silicon layer 12 are exceedingly thinner than that of the i-type crystalline silicon layer 13, the result of this X-ray diffraction method can be said to reflect the crystalline orientation of the i-type crystalline silicon layer 13.

Thereafter, ITO was deposited in a thickness of 50 nm to form the transparent electrode 15 by the magnetron sputtering method. Further, silver was deposited in a thickness of 500 nm by the electron beam vapor deposition method using a mask, so as to form the front electrode 16 in the form of a comb. The result was the thin-film solar cell 20 of a substrate type, in which incident light falls on the side of the front electrode 16.

The current-voltage characteristics of the thin-film solar cell 20 were measured under illumination light AM 1.5 (100 mW/cm$^2$). The result showed that the short-circuit current was 22.5 mA/cm$^2$, the open-circuit voltage 0.498 V, the fill factor 0.700, and the photo-electric conversion efficiency 7.84%.

This result indicates that the shape of the irregularities of the irregular surface layer 11c with the root mean square =23 nm and tan θ=0.13 is indeed suitable for obtaining desirable photo-electric conversion efficiency. The result also indicates that the diameter of the indentations on the surface of the irregular surface layer 11c in the foregoing range of 200 nm to 1400 nm as in this example is indeed a suitable condition for obtaining desirable photo-electric conversion efficiency.

Further, suitability of the shape of the irregularities on the surface of the p-type silicon layer 14 with the root mean square =18 nm and tan θ=0.06 will be examined in the following Example 3 in which irregularities on the surface of the silicon layer were formed under different conditions.

EXAMPLE 2

The following will describe another example of the thin-film solar cell of the present invention. Note that, constituting elements having the same functions as those described with reference to the drawing in the foregoing descriptions of the embodiment are given the same reference numerals and explanations thereof are omitted here.

In this example, the thin-film solar cell 20 was fabricated in the same manner as in Example 1 except that the solar cell substrate 11 was immersed in the hydrochloric acid aqueous solution for 45 seconds when etching its surface. By this modification, the height of the irregularities of the irregular surface layer 11c was expected to be higher than that in Example 1.

The irregular surface layer 11c was observed under the scanning electron microscope to find its shape, prior to forming the photo-electric conversion layer 21. The result was a large number of near hemispherical indentations with the surface diameter of about 400 nm to 1000 nm.

Further, in order to examine the irregular patterns of the irregular surface layer 11c in more detail, the atomic force microscope was used to measure the surface shape. The shape of the indentations of the irregular surface layer 11c of this Example was a near hemisphere or circular cone as in Example 1, and the root mean square height of the irregularities and tan θ were 47 nm and 0.23, respectively.

The surface patterns of the p-type silicon layer 14 were measured using the atomic force microscope after forming the photo-electric conversion layer 21 made of silicon layers. The measured root mean square height of the irregularities was 20 nm, and tan θ was 0.06.

Further, the X-ray diffraction method was carried out after forming the photo-electric conversion layer 21. The ratio $I_{220}/I_{111}$ of integral intensity $I_{220}$ at the X-ray diffraction peak of 220 to integral intensity $I_{111}$ at the X-ray diffraction peak of 111 was 2.8, which was essentially the same as that in Example 1.

The current-voltage characteristics of the thin-film solar cell 20 were measured under illumination light AM 1.5 (100 mW/cm$^2$). The result showed that the short-circuit current was 22.9 mA/cm$^2$, the open-circuit voltage 0.501 V, the fill factor 0.701, and the photo-electric conversion efficiency 8.04%.

In Example 2, the irregularities of the irregular surface layer 11c were formed under different conditions. The result was the root mean square height of the irregularities at 47 nm, tan θ at 0.23, and the surface diameter of the indentations of the irregular surface layer 11c at 400 nm to 1000 nm. With this result, photo-electric conversion efficiency was improved over that of Example 1.

Note that, as with Example 1, suitability of the shape of the irregularities on the surface of the p-type silicon layer 14 with the root mean square =20 nm and tan θ=0.06 will be examined in the following Example 3 in which irregularities on the surface of the silicon layer were formed under different conditions.

EXAMPLE 3

The following will describe yet another example of the thin-film solar cell of the present invention. Note that, constituting elements having the same functions as those described with reference to the drawing in the foregoing descriptions of the embodiment are given the same reference numerals and explanations thereof are omitted here.

In this example, the thin-film solar cell 20 was fabricated in the same manner as in Example 2 except that 250 SCCM of $SiH_4$ gas was used to form the i-type crystalline silicon layer 13. By this modification, the height of the irregularities of the i-type crystalline silicon layer 13 was expected to be higher.

After forming the photo-electric conversion layer 21 made up of silicon layers, the surface patterns of the p-type silicon layer 14, which is the approximation of the shape of the irregularities of the surface of the i-type crystalline silicon layer 13, were measured using the atomic force microscope. The result was the root mean square of 36 nm and tan θ of 0.19.

Further, the X-ray diffraction method was carried out. The ratio $I_{220}/I_{111}$ of integral intensity $I_{220}$ at the X-ray diffraction peak of 220 to integral intensity $I_{111}$ at the X-ray diffraction peak of 111 was 3.2, which was essentially the same as that of Example 1 or Example 2.

The current-voltage characteristics of the thin-film solar cell 20 were measured under illumination light AM 1.5 (100 mW/cm$^2$). The result showed that the short-circuit current was 24.1 mA/cm$^2$, the open-circuit voltage 0.500 V, the fill factor 0.702, and the photo-electric conversion efficiency 8.43%.

Comparing this with the results of Example 1 and Example 2, the open-circuit voltage and fill factor remain essentially the same between these examples. On the other hand, the short-circuit current is increased, indicating an improvement of photo-electric conversion efficiency. This is believed to be due to the surface shape of the p-type silicon layer 14 which is suitable for trapping light of the middle wavelength range.

Thus, it was found that the photo-electric conversion efficiency can be improved by forming irregularities on the irregular surface layer 11c with the 36 nm root mean square height of the irregularities on the surface of the p-type silicon layer 14 and tan θ at 0.19.

Comparative Example 1

The following will describe a comparative example of the thin-film solar cell of the present invention.

In this comparative example, the thin-film solar cell was fabricated in the same manner as in Example 1 except that the substrate was immersed in the hydrochloric acid aqueous solution for 15 seconds when etching its surface. By this modification, the height of the irregularities of the irregular surface layer was expected to be shorter than any of the foregoing examples.

The irregular surface layer was observed under the scanning electron microscope to find its shape, prior to forming the photo-electric conversion layer made up of silicon layers. The result was a large number of near hemispherical indentations with the surface diameter of about 50 nm to 200 nm. However, the number of indentations which were clearly identified as indentations was less than that in Example 1 or Example 2.

Further, in order to examine the irregular patterns of the irregular surface layer in more detail, the atomic force microscope was used to measure the surface shape. The shape of the indentations of the irregular surface layer of this example was a near hemisphere or circular cone as in Example 1, and the root mean square height of the irregularities and tan θ were 12 nm and 0.05, respectively.

Further, the X-ray diffraction method was carried out after forming the silicon layer on the irregular surface layer. The ratio $I_{220}/I_{111}$ of integral intensity $I_{220}$ at the X-ray diffraction peak of 220 to integral intensity $I_{111}$ at the X-ray diffraction peak of 111 was 3.2, which was essentially the same as those of Example 1 through Example 3.

The current-voltage characteristics of the thin-film solar cell of the present comparative example were measured under illumination light AM 1.5 (100 mW/cm$^2$). The result showed that the short-circuit current was 19.5 mA/cm$^2$, the open-circuit voltage 0.494 V, the fill factor 0.699, and the photo-electric conversion efficiency 6.73%. Comparing this with the results of Examples 1 through 3, the open-circuit voltage and fill factor remain essentially the same between these examples. On the other hand, the short-circuit current is decreased. This indicates that the irregular structure on the surface of the substrate is insufficient to exhibit the light-trapping effect, due to lack of enough etching time.

It was found from the this result that the irregular surface layer having desirable light-trapping effect cannot be obtained with the surface shape which was formed with the 12 nm root mean square height of the irregularities of the irregular surface layer and tan θ at 0.05. Further, it was also found that the irregular surface layer having desirable light-trapping effect cannot be obtained with the surface diameter of the indentations of the irregular surface layer in a range of 50 nm to 200 nm.

Conventional Example 1

The following describes a conventional thin-film solar cell to elucidate the effects of the thin-film solar cell of the present invention. Note that, the thin-film solar cell was fabricated in the same manner as in Example 1, except for the following two procedures.

Using a substrate (product name: Asahi-U), which is a flat glass substrate on which tin oxide is formed with surface irregularities by the atmospheric CVD method, silver was deposited on the substrate in the thickness of 500 nm by the electron beam vapor deposition method at the substrate temperature of 150° C. to form a rear electrode. Further, zinc oxide was deposited thereon in the thickness of 50 nm by the magnetron sputtering method at the substrate temperature of 150° C., so as to form a solar cell substrate with an irregular surface layer.

Note that, zinc oxide was used to prevent reduction of tin oxide by the hydrogen plasma during the formation of the crystalline silicon layer.

In order to examine the shape of the irregular surface layer of the solar cell substrate in more detail, the atomic force microscope was used to measure the surface shape. The shape of the irregular surface of this conventional example was a known pyramid, and the root mean square and tan θ were 32 nm and 0.35, respectively.

The X-ray diffraction method was carried out after forming the photo-electric conversion layer made up of the silicon layers. The ratio $I_{220}/I_{111}$ of integral intensity $I_{220}$ at the X-ray diffraction peak of 220 to integral intensity $I_{111}$ at the X-ray diffraction peak of 111 was 1.5.

The current-voltage characteristics of the thin-film solar cell were measured under illumination light AM 1.5 (100 mW/cm$^2$). The result showed that the short-circuit current was 21.0 mA/cm$^2$, the open-circuit voltage 0.491 V, the fill factor 0.692, and the photo-electric conversion efficiency 7.14%. Comparing this with the result of Examples 1 and 2, the short-circuit current, the open-circuit voltage, and fill factor are all decreased.

This, combined with the result of the X-ray diffraction method, indicates that the irregular structure of the irregular surface layer which was formed by the conventional method causes many defects during the formation of the crystalline silicon layer. This is due to the height of the irregularities that is too high and the incline angle that is too large. Thus, it was found that the irregularities of this conventional example cannot be used to fabricate the crystalline silicon thin-film solar cell with desirable light-trapping effect.

As is clear from the foregoing result, the thin-film solar cell with desirable light-trapping effect cannot be obtained with the irregularities which was formed by the conventional method.

Therefore, the results of the foregoing Examples 1 through 3, and Comparative Example and Conventional Example show that the solar cell substrate 11 having desirable light-trapping effect and the thin-film solar cell 20 having high photo-electric conversion efficiency can be provided when the root mean square height of irregularities of the irregular surface layer 11c is in a range of 15 nm to 600 nm and when tan θ is in a range of 0.10 to 0.30.

Further, it was found that irregularities which suit the foregoing conditions of the irregular shape can be formed when the diameter of the indentations of the irregular surface layer 11c is in a range of 200 nm to 2000 nm.

It was also found that the thin-film solar cell 20 with more desirable light-trapping effect can be obtained when the root mean square which indicates the height of irregularities on the surface of the p-type silicon layer 14 is in a range of 25 nm to 600 nm and when tan θ is in a range of 0.07 to 0.20.

Thus, it was found that the irregular structure of the solar cell substrate 11 of the present invention can be used to fabricate the thin-film solar cell 20 with high photo-electric conversion efficiency, without causing severe defects during the formation of the photo-electric conversion layer 21.

Second Embodiment

Figure 2:
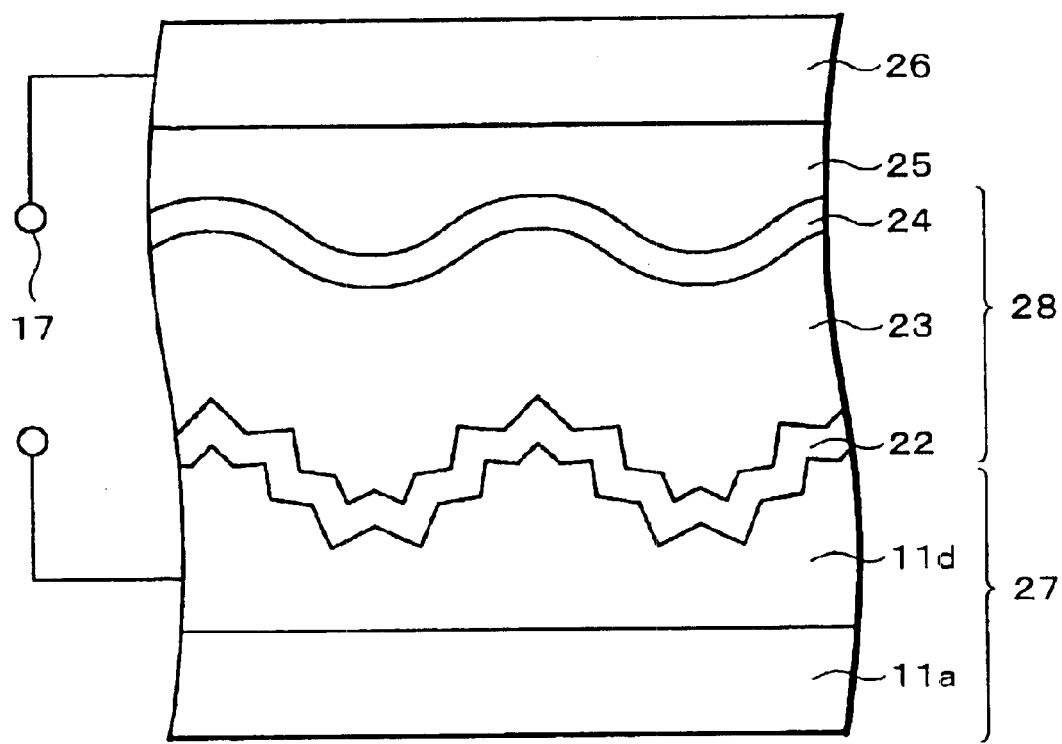
FIG. 2 is a cross sectional view showing a thin-film solar cell according to another embodiment of the present invention.

The following will describe another embodiment of the thin-film solar cell of the present invention with reference to FIG. 2.

Note that, constituting elements having the same functions as those described with reference to the drawing in the First Embodiment are given the same reference numerals and explanations thereof are omitted here.

As shown in FIG. 2, a thin-film solar cell 30 of the present invention includes a glass substrate 11a, an irregular surface layer 11d, a p-type crystalline silicon layer 22, an i-type crystalline silicon layer 23, an n-type silicon layer 24, a rear reflecting layer 25, and a rear electrode 26, which are stacked in this order from the bottom.

The thin-film solar cell 30 is of a so-called superstrate type in which light is incident on the side of the glass substrate 11a.

The glass substrate 11a and the irregular surface layer 11d make up a solar cell substrate 27.

The glass substrate 11a, which is a transparent substrate making up the solar cell substrate 27, has a thickness, for example, in a range of about 0.1 mm to 30 mm, but not particularly limited, so that it has a strength or mass which is sufficient to support the structure.

The glass substrate 11a is made of glass in the present embodiment, but other materials such as resin with a heat resisting property as high as about 200° C., such as polyimide or polyvinyl, or a combination of such resins stacked together can be used. Further, the surface of a substrate made of these materials may be coated with a metal film, a transparent conductive film, or an insulating film, etc.

The irregular surface layer 11d is made of a transparent conductive material, and it is formed by etching zinc oxide, which is a transparent conductive material.

Forming the transparent conductive film on the solar cell substrate 27 by forming irregularities thereon by etching is advantageous because it allows the surface pattern of the transparent conductive film to be easily controlled by suitably changing types of etchant, or concentration or time of etching. This makes it easier to form irregularities within a defined range which is determined by the root mean square height of the irregularities, and tan θ.

Note that, the solar cell substrate 27 can be manufactured less expensively than conventionally by using an acid or alkaline solution as the etchant. Examples of acid solution which can be used include solutions of hydrochloric acid, sulfuric acid, nitric acid, hydrofluoric acid, acetic acid, formic acid, and perchloric acid, which may be used individually or as a mixture of two or more kinds, among which hydrochloric acid and acetic acid are particularly preferable. These acid solutions can be used in a concentration, for example, in a range of about 0.05 weight % to 5.0 weight %, or, in the case of relatively weak acids such as acetic acid in particular, in a range of about 0.1 weight % to 5.0 weight %. Further, examples of alkaline solution which can be used include solutions of sodium hydroxide, ammonia, potassium hydroxide, calcium hydroxide, and aluminium hydroxide, which may be used individually or as a mixture of two or more kinds, among which sodium hydroxide is particularly preferable. These alkaline solutions can be used in a concentration, for example, in a range of about 1 weight % to 10 weight %.

Further, the use of transparent conductive material for the irregular surface layer 11d causes the incident light on the thin-film solar cell 30 to scatter at the interface of the irregular surface layer 11d and the photo-electric conversion layer 28. This increases the optical path length of light and thereby increases the light-trapping effect. As a result, photo-electric conversion efficiency is increased, thus reducing the thickness of the photo-electric conversion layer 28.

This makes it possible to reduce the thickness of the thin-film solar cell 30 made of crystalline silicon, thereby greatly reducing a deposit time. Further, impurities contained in the solar cell substrate 27 can be prevented from entering the photo-electric conversion layer 28 when forming the photo-electric conversion layer 28.

Further, zinc oxide, which is the transparent conductive material used to form the irregular surface layer 11d, has such characteristics that it can be provided inexpensively and it is hardly modified due to its high plasma resistance. This makes it possible to obtain the solar cell substrate 27 with high plasma resistance at low cost, compared with the case using such materials as tin oxide, indium oxide, or ITO, which have been widely used as the material of the transparent conductive film.

Note that, the transparent conductive material may include a trace amount of impurities. For example, when the main component is zinc oxide, elements which belong to Group IIIB of the periodic table, such as gallium or aluminium, or Group IB of the periodic table, such as copper may be included in an amount of about $5 \times 10^{20}$ cm$^{-3}$ to $5 \times 10^{21}$ cm$^{-3}$. This addition of impurities lowers a resistivity of the irregular surface layer 11d, and therefore is suitable when it is used as an electrode.

The thickness of the transparent conductive film, when it is too thin, may result in uneven characteristics as the solar cell. On the other hand, when it is too thick, transmittance and thus photo-electric conversion efficiency is reduced, which increases the deposit time and thus the cost. In view of these drawbacks, a thickness in a range of about 0.1 μm to 2.0 μm is preferable.

The transparent conductive film can be made by known-methods, for example, such as the sputtering method, atmospheric CVD method, low pressure CVD method, electron beam vapor deposition method, sol-gel method, and electrodeposition method. Among these methods, the sputtering method is particularly preferable because it makes it easier to control transmittance or resistivity of the irregular surface layer 11d within a suitable range for the thin-film solar cell 30.

Here, the root mean square height of the irregularities, and tan θ are used as indices which indicate the irregularities on the surface of the irregular surface layer 11d, where θ is the angle of incline of the irregular surface with respect to an average line of the irregularities. These indices are set so that the root mean square of the irregular surface layer 11d of the present embodiment is in a range of 25 nm to 600 nm, and tan θ is in a range of 0.07 to 0.20.

By thus forming the irregular surface layer 11d with the indices in these ranges, the irregularities on the surface of the solar cell substrate 27 are in contact with the photo-electric conversion layer 28. This scatters light at the interface, which increases the optical path length and thus the quantity of light absorbed in the photo-electric conversion layer 28. By this trapping effect of light, photo-electric conversion efficiency can be improved. The improved photo-electric conversion efficiency enables the photo-electric conversion layer 28 to have a thinner thickness, thereby greatly reducing deposit time and manufacturing cost required for the photo-electric conversion layer 28.

Further, according to the foregoing arrangement, since the root mean square is set in a range of 25 nm to 300 nm, and tan θ in a range of 0.07 to 0.20, occurrence of crystal collision in the photo-electric conversion layer 28 can be greatly reduced. As a result, it is ensured that photo-electric conversion efficiency does not suffer due to defects.

In other words, the irregular layer surface 11d can sufficiently have light-trapping effect by providing the solar cell substrate 27 with at least a single layer of irregular surface layer 11d, and by setting the root mean square at 25 nm or larger and tan θ at 0.07 or larger. Further, by setting the root mean square at or below 600 nm, and tan θ at or below 0.20, the height of the irregularities and the incline angle become suitable, and thus defects of the irregularities can be suppressed even when crystal grains of silicon formed on the irregular surface layer 11d collide.

Further, effects of the present invention can be more suitably obtained by setting the root mean square height of the irregularities within a range of 25 nm to 400 nm, and tan θ in a range of 0.07 to 0.15. By forming irregularities with the root mean square and tan θ within these ranges, it is further ensured that the irregular surface layer 11d has less defects and improved light-trapping effect.

Further, portions of the irregularities on the surface of the solar cell substrate 11 has indentations which are more gradual than the irregularities on the surface of the solar cell substrate 11. The indentations are in the form of a near hemisphere or circular cone with a diameter of 200 nm to 2000 nm.

In this way, the irregular surface layer 11d having irregularities can be formed with good reproducibility with the root mean square and tan θ in the foregoing ranges. As a result, light-trapping effect improves and the solar cell substrate 27 having high photo-electric conversion efficiency can be obtained.

Note that, the present invention can be implemented more effectively by forming the indentations with a diameter in a range of 400 nm to 1200 nm, because it further improves light-trapping effect and forms the irregular surface layer 11d with even less defects.

The present embodiment employs etching to form the irregular surface layer 11d. However, other than etching, for example, a film may be deposited on the glass substrate 11a with a flat surface so that irregularities are formed thereon as soon as the film is deposited. The material of the film used to form the irregular surface layer 11d may be the same as or different from that of the solar cell substrate 27. Further, the irregular surface layer 11d may be formed by mechanical means such as sand blast on the surface of the solar cell substrate 27.

Further, the photo-electric conversion layer 28 for converting incident light into electricity (i.e., so-called photo-electric conversion) includes the p-type crystalline silicon layer 22, i-type crystalline silicon layer 23, and n-type silicon layer 24.

The photo-electric conversion layer 28 has an irregular surface. The irregularities, which are provided by the i-type crystalline silicon layer 23, are formed under the following conditions, and the n-type silicon layer 24 is deposited thereon. Note that, since the n-type silicon layer 24 is thin, it can be regarded as approximation of the irregularities of the i-type crystalline silicon layer 23. The irregularities are formed at the root mean square height of the irregularities in a range of 15 nm to 600 nm, and tan θ in a range of 0.10 to 0.30.

By thus suitably forming irregularities on the both surfaces of the photo-electric conversion layer 28 and thereby adding irregularities which are formed under different conditions from the irregular surface layer 11d, the light-trapping effect can be sufficiently obtained both in the middle wavelength range of 450 nm to 650 nm and a longer wavelength range of the solar spectrum.

The irregularities may be formed on the surface of the i-type crystalline silicon layer 23 under the foregoing conditions, for example, by forming the photo-electric conversion layer 28 in such a manner that irregularities are formed as soon as the semiconductor layers (p-type crystalline silicon layer 22, i-type crystalline silicon layer 23, and n-type silicon layer 24) of the photo-electric conversion layer 28 are deposited. Here, the conditions of forming the irregularities on the surface of the photo-electric conversion layer 28 are decided by taking into consideration the influence of the irregularities on the surface of the irregular surface layer 11d of the solar-cell substrate 27. The irregularities can be formed also by mechanical means such as sand blast, or chemical means such as etching on the surface of the photo-electric conversion layer 28.

The rear reflecting layer 25 is a thin-film electrode made of zinc oxide, 50 nm thick, which is formed by the magnetron sputtering method.

The rear electrode 26 is formed by depositing silver in the thickness of 500 nm by the electron beam vapor deposition method, wherein electrodes 17 are drawn out from the rear electrode 26 and the irregular surface layer 11d, so as to provide the thin-film solar cell 30 of a superstrate type.

According to the foregoing arrangement, it is possible to provide the solar cell substrate 27 with high photo-electric conversion efficiency by the effect of light-trapping, together with the photo-electric conversion layer 28 which causes less defects on the irregularities of the irregular surface layer 11d which is provided to improve photo-electric conversion efficiency. Further, with the use of the solar cell substrate 27, the thin-film solar cell 30 can be provided with high photo-electric conversion efficiency at low cost.

Note that, the present embodiment described the case where the photo-electric conversion layer 28 is made up of a single photo-electric conversion element. However, the photo-electric conversion layer 28 may be provided with a plurality of photo-electric conversion elements, in which the active layer (I-type layer) of at least one of these photo-electric conversion elements is made of crystalline silicon or silicon alloy. This allows the use of light with a longer wavelength of 700 nm or longer, which cannot be used in the photo-electric conversion by amorphous silicon.

Note that, examples of silicon alloy include, for example, $Si_x Sn_{1-x}$, which is a mixture of silicon and tin, and $Si_x Ge_{1-x}$, which is a mixture of silicon and germanium.

The following describes effects of the present invention more specifically based on Examples 4 through 6, Comparative Example 2, and Conventional Example 2.

EXAMPLE 4

The following explains procedures of fabricating the solar cell substrate 27 and the thin-film solar cell 30 with reference to FIG. 2. Note that, constituting elements having the same functions as those described with reference to the drawing in the foregoing descriptions of the Second Embodiment are given the same reference numerals and explanations thereof are omitted here.

By the magnetron sputtering method, zinc oxide was deposited in the thickness of 500 nm on one of main flat surfaces of the glass substrate 11a at the substrate temperature of 150° C. The zinc oxide contained gallium in the amount of about $1 \times 10^{21}$ cm$^{-3}$. As a result, the zinc oxide had a sheet resistivity of 10 Ω/□ and a transmittance of 80% with respect to light of a wavelength at 800 nm.

Thereafter, the zinc oxide was etched. The glass substrate 11a coated with the zinc oxide was immersed in 0.5 weight % of a hydrochloric acid aqueous solution for 30 seconds at the liquid temperature of 25° C., and then the surface of the glass substrate 11a was rinsed thoroughly with pure water to obtain the solar cell substrate 27 with the irregular surface layer 11d. Observing surface patterns of the irregular surface layer 11d using a scanning electron microscope, a large number of indentations of a near hemisphere with the surface diameter of 200 nm to 1400 nm were found.

In order to examine the surface patterns of the irregular surface layer 11d in more detail, an atomic force microscope was used to measure the surface patterns. From the shape of the indentations in a direction of depth, the shape of the indentations was found to be a near hemisphere or a circular cone. In order to express the profile of the surface patterns in numerical values, the root mean square (RMS) height of the irregularities was used as the index which indicates the height of the irregularities. Further, most frequent wavelength W of a sinusoidal curve which is obtained by Fourier conversion of a curve of the surface pattern waveform was used as the index which indicates the pitch of the irregularities, and the slope of the irregular surface with respect to an average line of the surface irregularities was denoted as θ. This gave tan θ=2RMS/(W/2)=4RMS/W, whereby the root mean square and tan θ were used as the indices of the profile of the irregularities. In this example, the root mean square was 28 nm and tan θ was 0.08.

On the solar cell substrate 27 so obtained, the p-type crystalline silicon layer 22, the i-type crystalline silicon layer 23, and the n-type silicon layer 24 were deposited in this order by the plasma CVD method at the high frequency of 13.56 MHz.

The p-type crystalline silicon layer 22 was deposited in the thickness of 30 nm under the following conditions: 3 SCCM of SiH$_4$ gas; 600 SCCM of H$_2$ gas; 1 SCCM of B$_2$H$_6$ gas which was adjusted to 5000 ppm using H$_2$ gas; a pressure of a deposit room at 200 Pa; discharge power of 25 W; and a substrate temperature of 140° C. The i-type crystalline silicon layer 23 was deposited in the thickness of 2500 nm under the following conditions: 11 SCCM of SiH$_4$ gas; 350 SCCM of H$_2$ gas; a pressure of a deposit room at 200 Pa; discharge power of 20 W; and a substrate temperature of 140° C. The n-type silicon layer 24 was deposited in the thickness of 30 nm under the following conditions: 10 SCCM of SiH$_4$ gas; 100 SCCM of PH$_3$ gas which was adjusted to 1000 ppm by H$_2$ gas; a pressure of a deposit room at 27 Pa; discharge power of 30 W; and a substrate temperature of 180° C.

The whole was then taken out of the plasma CVD device (not shown) and surface patterns of the n-type silicon layer 24 were observed using the atomic force microscope. The measurement showed that the root mean square height of the irregularities was 18 nm, and tan θ was 0.06.

Further, the surface of the n-type silicon layer 24 was examined by the X-ray diffraction method, which showed that the ratio $I_{220}/I_{111}$ of integral intensity $I_{220}$ at the X-ray diffraction peak of 220 to integral intensity $I_{111}$ at the X-ray diffraction peak of 111 was 3.0. Here, the peaks of X-ray diffraction are not derived from the i-type crystalline silicon layer 23 itself. However, since the thicknesses of the p-type crystalline silicon layer 22 and the n-type silicon layer 24 are exceedingly thinner than that of the i-type crystalline silicon layer 23, the result of this X-ray diffraction method can be said to reflect the crystalline orientation of the i-type crystalline silicon layer 23.

Thereafter, zinc oxide was deposited in the thickness of 50 nm to form the rear reflecting layer 25 by the magnetron sputtering method. Further, silver was deposited in a thickness of 500 nm by the electron beam vapor deposition method, so as to form the rear electrode 26, thereby forming the thin-film solar cell 30 of a superstrate type, in which incident light falls on the side of the glass substrate 11a.

The current-voltage characteristics of the thin-film solar cell 30 were measured under illumination light AM 1.5 (100 mW/cm$^2$). The result showed that the short-circuit current was 25.0 mA/cm$^2$, the open-circuit voltage 0.524 V, the fill factor 0.700, and the photo-electric conversion efficiency 9.17%.

This result shows that the shape of irregularities of the irregular surface layer 11d with the root mean square 28 nm and tan θ=0.08 is indeed suitable for obtaining desirable photo-electric conversion efficiency, compared with Comparative Examples and Conventional Examples described below. The result also shows that the diameter of the indentations on the surface of the irregular surface layer 11d in the foregoing range of 200 nm to 1400 nm as in this Example is indeed a suitable condition for obtaining the irregular surface layer 11d with irregularities under the foregoing conditions.

Further, suitability of the shape of the irregularities on the surface of the n-type silicon layer 24 to obtain the light-trapping effect with the root mean square =18 nm and tan θ =0.06 will be examined in the following Example 6 in which irregularities on the surface of the silicon layer were formed under different conditions.

EXAMPLE 5

The following will describe another example of the thin-film solar cell of the present invention. Note that, constituting elements having the same functions as those described with reference to the drawing in the foregoing descriptions of the Second Embodiment are given the same reference numerals and explanations thereof are omitted here.

In this Example, the thin-film solar cell was fabricated in the same manner as in Example 4 except that the solar cell substrate 27 was immersed in the hydrochloric acid aqueous solution for 45 seconds when etching its surface. By this modification, the height of irregularities of the irregular surface layer 11d was expected to be higher than that in Example 4.

The irregular surface layer 11d was observed under the scanning electron microscope to find its shape, prior to forming the photo-electric conversion layer 28. The result was a large number of near hemispherical indentations with the surface diameter of about 400 nm to 1000 nm.

Further, in order to examine the irregular patterns of the irregular surface layer 11d in more detail, the atomic force microscope was used to measure the surface shape. The shape of the indentations of the irregular surface layer 11d of this Example was a near hemisphere or circular cone as in Example 4, and the root mean square height of the irregularities and tan θ were 40 nm and 0.13, respectively.

The surface patterns of the n-type silicon layer 24 were measured using the atomic force microscope after forming the photo-electric conversion layer 28 made up of the silicon layers. The measured root mean square height of irregularities was 20 nm, and tan θ was 0.06.

Further, the X-ray diffraction method was carried out after forming the photo-electric conversion layer 28. The ratio $I_{220}/I_{111}$ of integral intensity $I_{220}$ at the X-ray diffraction peak of 220 to integral intensity $I_{111}$ at the X-ray diffraction peak of 111 was 2.8, which was essentially the same as that in Example 4.

The current-voltage characteristics of the thin-film solar cell were measured under illumination light AM 1.5 (100 mW/cm$^2$). The result showed that the short-circuit current was 25.4 mA/cm$^2$, the open-circuit voltage 0.527 V, the fill factor 0.701, and the photo-electric conversion efficiency 9.38%.

In Example 5, the irregularities of the irregular surface layer 11d were formed under different conditions. The result was the root mean square height of the irregularities at 40 nm, tan θ at 0.23. With this result, photo-electric conversion efficiency was improved over that of Example 4.

Note that, as with Example 4, suitability of the shape of the irregularities on the surface of the n-type silicon layer 24 to obtain desirable light-trapping effect with the root mean square =20 nm and tan θ=0.06 will be examined in the following Example 6 in which irregularities on the surface of the silicon layer were formed under different conditions.

EXAMPLE 6

The following will describe yet another example of the thin-film solar cell of the present invention. Note that, constituting elements having the same functions as those described with reference to the drawing in the foregoing descriptions of the Second Embodiment are given the same reference numerals and explanations thereof are omitted here.

In this Example, the thin-film solar cell 30 was fabricated in the same manner as in Example 5 except that 250 SCCM of SiH$_4$ gas was used to form the i-type crystalline silicon layer 23. By this modification, the height of irregularities of the i-type crystalline silicon layer 23 was expected to be higher.

After forming the photo-electric conversion layer 28 made up of silicon layers, the surface patterns of the n-type silicon layer 24, which is the approximation of the shape of irregularities of the surface of the i-type crystalline silicon layer 23, were measured using the atomic force microscope. The result was the root mean square of 26 nm and tan θ of 0.09.

Further, the X-ray diffraction method was carried out. The ratio $I_{220}/I_{111}$ of integral intensity $I_{220}$ at the X-ray diffraction peak of 220 to integral intensity $I_{111}$ at the X-ray diffraction peak of 111 was 3.2, which was essentially the same as that in Example 4 or Example 5.

The current-voltage characteristics of the thin-film solar cell were measured under illumination light AM 1.5 (100 mW/cm$^2$). The result showed that the short-circuit current was 26.8 mA/cm$^2$, the open-circuit voltage 0.525 V, the fill factor 0.702, and the photo-electric conversion efficiency 9.88%.

Comparing this with the results of Example 4 and Example 5, the open-circuit voltage and fill factor remain substantially the same between these examples. On the other hand, the short-circuit current is increased, indicating an improvement of photo-electric conversion efficiency. This is believed to be due to the surface shape of the n-type silicon layer 24 which is suitable for trapping light of the longer wavelength range.

Thus, it was found that the photo-electric conversion efficiency can be improved by forming irregularities on the n-type silicon layer 24 with the 26 nm root mean square height of the irregularities on the surface of the n-type silicon layer 24 and tan θ=0.09.

Comparative Example 2

The following will describe a comparative example of the thin-film solar cell of the present invention.

In this comparative example, the thin-film solar cell was fabricated in the same manner as in Example 4 except that the substrate was immersed in the hydrochloric acid aqueous solution for 15 seconds when etching its surface. By this modification, the height of irregularities of the irregular surface layer was expected to be shorter than any of the foregoing examples.

The irregular surface layer was observed under the scanning electron microscope to find its shape, prior to forming the photo-electric conversion layer made up of the silicon layers. The result was near hemispherical indentations with the surface diameter of about 50 nm to 200 nm. However, the number of indentations which were clearly identified as indentations was less than that in Example 4 or Example 5.

Further, in order to examine the irregular patterns of the irregular surface layer in more detail, the atomic force microscope was used to measure the surface shape. The shape of the indentations of the irregular surface layer of this example was a near hemisphere or circular cone as in Example 4, and the root mean square height of the irregularities and tan θ were 12 nm and 0.05, respectively.

Further, the X-ray diffraction method was carried out after forming the photo-electric conversion layer. The ratio $I_{220}/I_{111}$ of integral intensity $I_{220}$ at the X-ray diffraction peak of 220 to integral intensity $I_{111}$ at the X-ray diffraction peak of 111 was 3.2, which was essentially the same as those of Example 4 through Example 6.

The current-voltage characteristics of the thin-film solar cell were measured under illumination light AM 1.5 (100 mW/cm$^2$). The result showed that the short-circuit current was 22.9 mA/cm$^2$, the open-circuit voltage 0.520 V, the fill factor 0.699, and the photo-electric conversion efficiency 8.32%.

Comparing this with the result of Examples 4 through 6, the open-circuit voltage and fill factor remain substantially the same between these examples. On the other hand, the short-circuit current is decreased. This indicates that the irregular structure on the surface of the solar cell substrate is insufficient to exhibit the light-trapping effect, due to lack of enough etching time.

It was found from the foregoing result that the irregular surface layer having desirable light-trapping effect cannot be obtained with the surface shape with the 12 nm root mean square height of the irregularities of the irregular surface layer and tan θ=0.05. Further, it was also found that the irregular surface layer having desirable light-trapping effect cannot be obtained with the surface diameter of the indentations of the irregular surface layer in a range of 50 nm to 200 nm.

Conventional Example 2

The following describes a conventional thin-film solar cell to elucidate the effects of the thin-film solar cell of the present invention.

Using a substrate (product name: Asahi-U), which is a flat glass substrate on which tin oxide is formed with surface irregularities by the atmospheric CVD method, silver was deposited on the substrate in the thickness of 500 nm by the electron beam vapor deposition method at the substrate temperature of 150° C. to form a rear electrode. Further, zinc oxide was deposited thereon in the thickness of 50 nm by the magnetron sputtering method at the substrate temperature of 150° C., so as to form a thin-film solar cell with the irregular surface layer.

Note that, zinc oxide is used to prevent reduction of tin oxide by the hydrogen plasma during the formation of the crystalline silicon layer.

In order to examine the shape of the irregular surface layer of the solar cell substrate in more detail, the atomic force microscope was used to measure the surface shape. The shape of the irregular surface of this conventional example was a known pyramid, and the root mean square and tan θ were 42 nm and 0.31, respectively.

The X-ray diffraction method was carried out after forming the photo-electric conversion layer made up of the silicon layers. The ratio $I_{220}/I_{111}$ of integral intensity $I_{220}$ at the X-ray diffraction peak of 220 to integral intensity $I_{111}$ at the X-ray diffraction peak of 111 was 1.5.

The current-voltage characteristics of the thin-film solar cell were measured under illumination light AM 1.5 (100 mW/cm$^2$). The result showed that the short-circuit current was 24.7 mA/cm$^2$, the open-circuit voltage 0.517 V, the fill factor 0.692, and the photo-electric conversion efficiency 8.84%.

Comparing this with the results of Examples 4 through 6, the short-circuit current, the open-circuit voltage, and fill factor are all decreased.

This, combined with the result of the X-ray diffraction method, indicates that the irregular surface structure of the conventional substrate causes defects during the formation of the crystalline silicon layer and therefore is not suitable for the crystalline silicon thin-film solar cell. Thus, it was found that the irregularities of this conventional example (root means square =42 nm, tan θ=0.31) fails to obtain desirable light-trapping effect and cannot be used to fabricate the thin-film solar cell with high photo-electric conversion efficiency.

In order to reduce defects in the irregular surface layer and obtain desirable light-trapping effect, it is effective to lower the height of the irregularities and reduce the incline angle from those of this conventional example.

Therefore, the results of the foregoing Examples 4 through 6, and Comparative Example 2 and Conventional Example 2 show that irregularities with desirable light-trapping effect can be formed when the root mean square height of the irregularities of the irregular surface layer 11d is in a range of 25 nm to 600 nm and when tan θ is in a range of 0.07 to 0.20.

Further, it was found that irregularities which suit the foregoing conditions of the irregular shape can be formed when the diameter of the indentations, which are portions of the irregular surface layer 11d, is in a range of 200 nm to 2000 nm.

It was also found that the thin-film solar cell 30 with more desirable light-trapping effect can be obtained when the root mean square which indicates the height of irregularities on the surface of the n-type silicon layer 24 is in a range of 15 nm to 600 nm and when tan θ is in a range of 0.10 to 0.30.

Thus, it was found that the irregular structure of the solar cell substrate 27 of the present invention can be used to fabricate the thin-film solar cell 30 with high photo-electric conversion efficiency, without causing severe defects during the formation of the photo-electric conversion layer 28.

Third Embodiment

Figure 3:
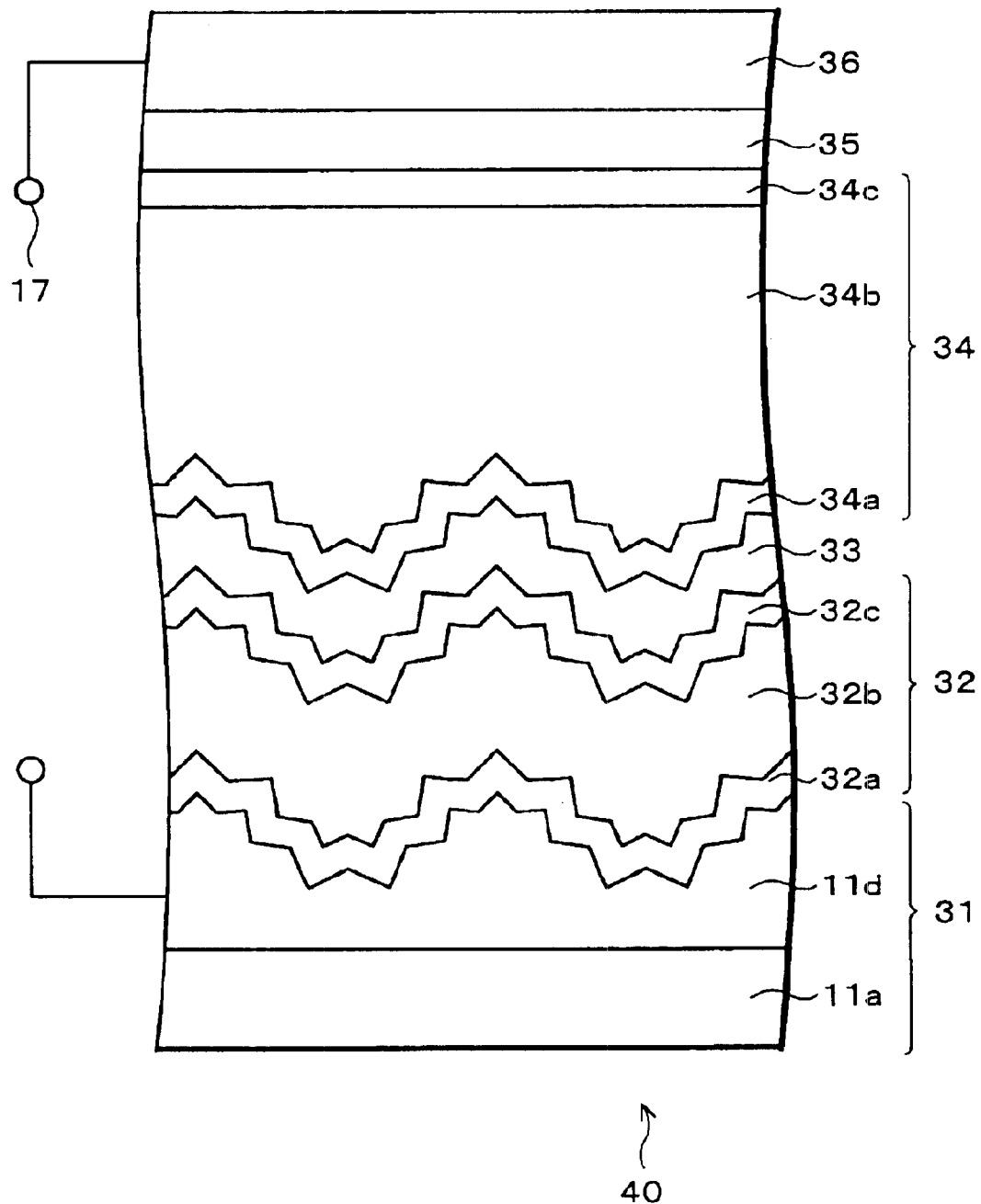
FIG. 3 is a cross sectional view showing a multi-junction thin-film solar cell according to yet another embodiment of the present invention.

The following will describe an embodiment of the multi-junction thin-film solar cell of the present invention with reference to FIG. 3.

Note that, constituting elements having the same functions as those described with reference to the drawing in the First and Second Embodiments are given the same reference numerals and explanations thereof are omitted here.

As shown in FIG. 3, a multi-junction thin-film solar cell 40 of the present invention includes a glass substrate 11a, an irregular surface layer 11d, an amorphous silicon photo-electric conversion layer 32, an intermediate layer 33, a crystalline silicon photo-electric conversion layer 34, a rear reflecting layer 35, a rear electrode 36, which are stacked in this order from the bottom.

Further, the multi-junction thin-film solar cell 40 is of a superstrate type in which light is incident on the side of the glass substrate 11a, and a plurality of photo-electric conversion layers of different types, namely, the amorphous silicon photo-electric conversion layer 32 and the crystalline silicon photo-electric conversion layer 34 are provided.

The glass substrate 11a and the irregular surface layer 11d make up a solar cell substrate 31.

The glass substrate 11a is a transparent glass substrate which makes up the solar cell substrate 31. The thickness of the glass substrate 11a is, for example, in a range of about 0.1 mm to 30 mm, but not particularly limited, so that it has a strength or mass which is sufficient to support the structure.

The transparent substrate is made of glass in the present embodiment, but other materials such as resin with a heat resisting property as high as about 200° C., such as polyimide or polyvinyl, or a combination of such resins stacked together can be used. Further, the surface of a substrate made of these materials may be coated with a metal film, a transparent conductive film, or an insulating film, etc.

The irregular surface layer 11d is made of a transparent conductive material, and it is formed by etching zinc oxide, which is a transparent conductive material. Using a transparent conductive material such as tin oxide, indium oxide, ITO, or zinc oxide is advantageous because it increases the optical path length by scattering incident light at the interface of the amorphous silicon photo-electric conversion layer 32 and the irregular surface layer 11d, and thus improves light-trapping effect together with the effect of irregularities which are formed on the intermediate layer, as will be described later. Further, by using zinc oxide, it is possible to provide the solar cell substrate 31 at low cost and with high resistance to modifications due to its high plasma resistance.

The amorphous silicon photo-electric conversion layer (photo-electric conversion element) 32 for converting incident light on the multi-junction thin-film solar cell 40 into electricity is made up of a p-type amorphous silicon layer 32a, an i-type amorphous silicon layer 32b, and an n-type silicon layer 32c.

Similarly, the crystalline silicon photo-electric conversion layer (photo-electric conversion element) 34 is made up of a p-type crystalline silicon layer 34a, an i-type crystalline silicon layer 34b, and an n-type silicon layer 34c.

The intermediate layer 33 is provided between adjacent layers of photo-electric conversion elements of different conduction types (amorphous silicon photo-electric conversion layer 32 and crystalline silicon photo-electric conversion layer 34). The intermediate layer 33 is provided to prevent such deficiency as a connection failure due to mixing of impurities which occurs in the process of making a connection of the opposite direction when layers of different conduction types are directly connected.

Further, the intermediate layer 33 is made of a transparent conductive material of zinc oxide.

Other examples of the transparent conductive material include tin oxide, indium oxide, and ITO. However, the use of zinc oxide as the transparent conductive material has an advantage over other materials in stably providing the multi-junction thin-film solar cell 40 at low cost and with high plasma resistance.

Further, the intermediate layer 33 may be made of a sole material, or made up of plural layers of different materials as exemplified above. However, it is preferable that the surfaces of the intermediate layer 33, in particular the surface on the far side of the glass substrate 11a, be made of a transparent conductive film. The transparent conductive film can be made by known-methods, for example, such as the sputtering method, atmospheric CVD method, low pressure CVD method, electron beam vapor deposition method, sol-gel method, and electrodeposition method. Among these methods, the sputtering method is particularly preferable because it makes it easier to control transmittance or resistivity of the transparent conductive film within a suitable range for the multi-junction thin-film solar cell 40.

Note that, the material of the transparent conductive film making up the intermediate layer 33 may include a trace amount of impurities. For example, when the main component is zinc oxide, elements which belong to Group IIIB of the periodic table, such as gallium or aluminium, or Group IB of the periodic table, such as copper may be included in an amount of about $5 \times 10^{20}$ cm$^{-3}$ to $5 \times 10^{21}$ cm$^{-3}$. This addition of impurities lowers resistivity of the intermediate layer 33.

The thickness of the transparent conductive film, when it is too thin, may result in uneven characteristics as the solar cell. On the other hand, when it is too thick, transmittance and thus photo-electric conversion efficiency is reduced by the increased series resistance, and the cost is increased. In view of these drawbacks, a thickness in a range of about 1 nm to 50 nm is preferable.

The present embodiment employs a chemical treatment by etching to provide irregularities on a surface of the intermediate layer 33. This allows the surface pattern of the transparent conductive film to be easily controlled, when a surface of the intermediate layer 33 is the transparent conductive film, by suitably changing types of etchant, or concentration or time of etching.

The multi-junction thin-film solar cell 40 can be manufactured even less expensively by using an acid or alkaline solution as the etchant. Examples of acid solution which can be used include solutions of hydrochloric acid, sulfuric acid, nitric acid, hydrofluoric acid, acetic acid, formic acid, and perchloric acid, which may be used individually or as a mixture of two or more kinds, among which hydrochloric acid and acetic acid are particularly preferable. These acid solutions can be used in a concentration, for example, in a range of about 0.05 weight % to 5.0 weight % or, in the case of relatively weak acids such as acetic acid in particular, in a range of about 0.1 weight % to 5.0 weight %. Further, examples of alkaline solution which can be used include solutions of sodium hydroxide, ammonia, potassium hydroxide, calcium hydroxide, and aluminium hydroxide, which may be used individually or as a mixture of two or more kinds, among which sodium hydroxide is particularly preferable. These alkaline solutions can be used in a concentration, for example, in a range of about 1 weight % to 10 weight %.

Other than etching, the intermediate layer 33 may be provided with an irregular surface by forming the intermediate layer 33 under such conditions that, for example, irregularities are formed as soon as the intermediate layer 33 is deposited. Here, the conditions of forming the irregularities on the surface of the intermediate layer 33 are decided by taking into consideration the influence of the irregular patterns of the underlying amorphous silicon photo-electric conversion layer 32. The intermediate layer 33 can also have irregularities by mechanical means such as sand blast.

In the present embodiment, the surface of the intermediate layer 33 after etching has irregularities. Here, the root mean square which indicates the height of the irregularities of the intermediate layer 33 is set within a range of 25 nm to 600 nm, and tan θ is set within a range of 0.07 to 0.20, where θ is the angle of incline of the irregular surface with respect to an average line of the irregularities on the surface of the intermediate layer 33.

By thus forming the intermediate layer 33 so that the irregularities of the surface are in contact with the crystalline silicon photo-electric layer 34 (p-type crystalline silicon layer 34a), light is scattered at the interface. This scattering of light increases the optical path length and thereby increases the quantity of light absorbed by the crystalline silicon photo-electric conversion layer 34. This light-trapping effect improves photo-conversion efficiency, which enables the crystalline silicon photo-electric conversion layer 34 to have a thinner thickness. As a result, it is possible to greatly reduce deposit time and manufacturing cost for the crystalline silicon photo-electric conversion layer 34.

Further, according to the present invention, the height of the irregularities is set so that the root mean square height is within a range of 25 nm to 600 nm, and tan θ is set within a range of 0.07 to 0.20, where θ is the angle of incline of the irregular surface with respect to an average line of the irregularities. Thus, it is ensured that collision of crystals is avoided. As a result, deterioration of photo-electric conversion efficiency is caused much less often by defects, thus obtaining the multi-junction thin-film solar cell 40 which is stable and has high photo-electric conversion efficiency.

Note that, in order to obtain effects of the present invention more effectively, the root mean square height may be set in a range of 25 nm to 400 nm, and tan θ in a range of 0.07 to 0.15. This further ensures that the intermediate layer 33 with improved light-trapping effect and less defects is provided.

Further, the surface of the intermediate layer 33 is etched to have indentations in the form of a near hemisphere or circular cone. The diameter of the indentations is controlled by etching to fall in a range of 200 nm to 2000 nm.

In this way, it is possible to provide, with good reproducibility, the intermediate layer having high light-trapping effect with suitable ranges of root mean square height, and tan θ, where θ is the angle of incline (root mean square =25 nm to 600 nm, tan θ=0.07 to 0.20). Further, it is further ensured that the intermediate layer with irregularities can be suitably provided with good reproducibility when the diameter of the indentations is in a range of 400 nm to 1200 nm.

The rear reflecting layer 35 is a thin film made of zinc oxide, 50 nm thick, which is formed by the magnetron sputtering method.

The rear electrode 36 is formed by depositing silver in the thickness of 500 nm by the electron beam vapor deposition method, wherein electrodes 17 are drawn out from the rear electrode 36 and the irregular surface layer 11d, so as to make up the multi-junction thin-film solar cell 40 of a superstrate type in which light is incident on the side of the glass substrate 11b.

According to the foregoing arrangement, it is possible to provide the multi-junction thin-film solar cell 40 with high photo-electric conversion efficiency, together with the crystalline silicon photo-electric conversion layer 34 which causes less defects on the irregularities of the intermediate layer 33 which is provided to improve photo-electric conversion efficiency.

Note that, the present embodiment described the case where the crystalline silicon photo-electric conversion layer 34 is made up of a single photo-electric conversion element. However, the crystalline silicon photo-electric conversion layer 34 may be provided with a plurality of photo-electric conversion elements, in which the active layer (I-type layer) of at least one of these photo-electric conversion elements is made of crystalline silicon or silicon alloy. This allows the use of light of a wavelength of 700 nm or longer, which cannot be used in the photo-electric conversion by amorphous silicon, thus providing the multi-junction thin-film solar cell 40 which is stable and has high photo-electric conversion efficiency, capable of suppressing deterioration of light.

In particular, the photo-electric conversion element whose active layer is made of crystalline silicon or silicon alloy is preferably provided on the surface on the far side of the glass substrate 11a of the intermediate layer 33 because it provides the multi-junction thin-film solar cell 40 with sufficient light-trapping effect and less defects, in addition to providing stability and high photo-electric conversion efficiency. Note that, examples of silicon alloy include, for example, $Si_xSn_{1-x}$, which is a mixture of silicon and tin, and $Si_xGe_{1-x}$, which is a mixture of silicon and germanium.

Further, the present embodiment described the multi-junction thin-film solar cell 40 of a superstrate type in which light is incident on the side of the glass substrate 11a, wherein the glass substrate 11a has a flat surface on which a transparent conductive film having an irregular layer is provided thereon, and the intermediate layer 33 made of zinc oxide is provided between the amorphous silicon photo-electric conversion layer 32 and the crystalline silicon photo-electric conversion layer 34.

However, the present invention is not just limited to this embodiment, and is also applicable to a multi-junction thin-film solar cell of a substrate type, for example, by adopting an arrangement in which the rear reflecting layer and irregular surface layer are deposited on a substrate, so that the position of the photo-electric conversion layer is up-side-down, and light is incident on the side of the rear electrode.

The following will describe effects of the present invention more specifically based on Examples 7 through 9, and Comparative Example 3.

EXAMPLE 7

The following explains procedures of fabricating the multi-junction thin-film solar cell 40 with reference to FIG. 3. Note that, constituting elements having the same functions as those described with reference to the drawing in the foregoing descriptions of the Third Embodiment are given the same reference numerals and explanations thereof are omitted here.

By the magnetron sputtering method, zinc oxide was deposited in the thickness of 500 nm on a main flat surface of the glass substrate 11a of FIG. 3 at the substrate temperature of 150° C. The zinc oxide contained gallium in the amount of about $1\times10^{21}$ cm$^{-3}$. As a result, the zinc oxide had a sheet resistivity of 10 Ω/□ and a transmittance of 80% with respect to light at the wavelength of 800 nm.

Thereafter, the zinc oxide was etched. The glass substrate coated with the zinc oxide was immersed in 0.5 weight % of a hydrochloric acid aqueous solution for 15 seconds at the liquid temperature of 25° C., and then the surface of the glass substrate was rinsed thoroughly with pure water to obtain the solar cell substrate 31 with the irregular surface layer 11d.

On the solar cell substrate 31 thus obtained, the p-type amorphous silicon layer 32a, i-type amorphous silicon layer 32b, and n-type silicon layer 32c were deposited in this order at the frequency of 13.56 MHZ to form the amorphous silicon photo-electric conversion layer 32. The p-type amorphous silicon layer 32a was deposited in the thickness of 15 nm under the following conditions: 12 SCCM of SiH$_4$ gas; 30 SCCM of H$_2$ gas; 1 SCCM of B$_2$H$_6$ gas which was adjusted to 5000 ppm using H$_2$ gas; a pressure of a deposit room at 20 Pa; discharge power of 25 W; and a substrate temperature of 180° C. The i-type amorphous silicon layer 32b was deposited in the thickness of 350 nm under the following conditions: 30 SCCM of SiH$_4$ gas; 70 SCCM of H$_2$ gas; a pressure of a deposit room at 30 Pa; discharge power of 30 W; and a substrate temperature of 180° C. The n-type silicon layer 32c was deposited in the thickness of 30 nm under the following conditions: 10 SCCM of SiH$_4$ gas; 100 SCCM of PH$_3$ gas which was adjusted to 1000 ppm by H$_2$ gas; a pressure of a deposit room at 27 Pa; discharge power of 30 W; and a substrate temperature of 180° C.

The whole was then taken out of the plasma CVD device (not shown), and the intermediate layer 33 was formed using zinc oxide by the magnetron sputtering method under the same conditions as that used to form the substrate. However, the thickness of the intermediate layer 33 was set at 250 nm, taking into account the thickness which is lost during etching. Observing surface patterns of the intermediate layer 33 using a scanning electron microscope, indentations of a near hemisphere with the surface diameter of 50 nm to 200 nm were found.

In order to examine the surface patterns of the intermediate layer 33 in more detail, an atomic force microscope was used to measure the surface patterns. From the shape of the indentations in a direction of depth, the shape of the indentations was found to be a near hemisphere or a circular cone. In order to express the profile of the surface patterns in numerical values, the root mean square (RMS) height of the irregularities was used as the index which indicates the height of the irregularities. Further, most frequent wavelength W of a sinusoidal curve which is obtained by Fourier conversion of a curve of the surface pattern waveform was used as the index which indicates the pitch of irregularities, and the slope of the irregular surface with respect to an average line of the surface irregularities was denoted as θ. This gave $\tan θ = 2\text{RMS}/(W/2) = 4\text{RMS}/W$, whereby the root mean square and tan θ were used as the indices of the profile of the irregularities. In this example, the root mean square was 12 nm and tan θ was 0.05.

Thereafter, the whole was immersed in a 0.5 weight % hydrochloric acid aqueous solution for 15 seconds at the liquid temperature of 25° C. to etch the surface of the intermediate layer 33. After rinsing the surface of the intermediate layer 33 thoroughly with pure water, the surface of the intermediate layer 33 was observed under the scanning electron microscope to find its shape. The result was a large number of indentations in the form of a near hemisphere with a surface diameter in a range of 400 nm to 1200 nm.

In order to examine the surface patterns of the intermediate layer 33 in more detail, an atomic force microscope was used to measure the surface patterns. The shape of the indentations on the surface of the irregular surface layer in this example was also a near hemisphere or circular cone as in was the case prior to etching, but the root mean square height of the irregularities and tan θ were 32 nm and 0.10, respectively, in this example.

The high frequency plasma CVD method was used again to form the crystalline silicon photo-electric conversion layer 34 by depositing the p-type crystalline silicon layer 14a, i-type crystalline silicon layer 34b, and n-type silicon layer 34c in this order on the intermediate layer 33, by the high frequency plasma CVD method at the frequency of 13.56 MHZ. The p-type crystalline silicon layer 34a was deposited in the thickness of 30 nm under the following conditions: 3 SCCM of SiH$_4$ gas; 600 SCCM of H$_2$ gas; 1 SCCM of B$_2$H$_6$ gas which was adjusted to 5000 ppm using H$_2$ gas; a pressure of a deposit room at 200 Pa; discharge power of 25 W; and a substrate temperature of 140° C. The i-type crystalline silicon layer 34b was deposited in the thickness of 2500 nm under the following conditions: 11 SCCM of SiH$_4$ gas; 350 SCCM of H$_2$ gas; a pressure of a deposit room at 200 Pa; discharge power of 20 W; and a substrate temperature of 140° C. The n-type silicon layer 34c was deposited in the thickness of 30 nm under the following conditions: 10 SCCM of SiH$_4$ gas; 100 SCCM of PH$_3$ gas which was adjusted to 1000 ppm by H$_2$ gas; a pressure of a deposit room at 27 Pa; discharge power of 30 W; and a substrate temperature of 180° C.

The whole was then taken out of the plasma CVD device (not shown), and the photo-electric conversion layer was examined by the X-ray diffraction method, which showed that the ratio $I_{220}/I_{111}$ of integral intensity $I_{220}$ at the X-ray diffraction peak of 220 to integral intensity $I_{111}$ at the X-ray diffraction peak of 111 was 2.9. Here, the peaks of X-ray diffraction are not derived from the i-type crystalline silicon layer itself. However, since the thicknesses of the p-type crystalline silicon layer and the n-type silicon layer are exceedingly thinner than that of the i-type crystalline silicon layer, the result of this X-ray diffraction method can be said to reflect the crystalline orientation of the i-type crystalline silicon layer.

Thereafter, zinc oxide was deposited in the thickness of 50 nm to form the rear reflecting layer 35 by the magnetron sputtering method, and silver was deposited in a thickness of 500 nm by the electron beam vapor deposition method to form the rear electrode 36, thereby forming the multi-junction thin-film solar cell 40 of a superstrate type, in which incident light falls on the side of the glass substrate 11a. The cell area was 1 cm$^2$.

The current-voltage characteristics of the multi-junction thin-film solar cell 40 were measured under illumination light AM 1.5 (100 mW/cm$^2$). The result showed that the short-circuit current was 12.8 mA/cm$^2$, the open-circuit voltage 1.205 V, the fill factor 0.695, and the photo-electric conversion efficiency 10.72%.

This result shows that the shape of the irregularities of the intermediate layer 33 with the root mean square =32 nm and tan θ=0.10 is indeed suitable for obtaining desirable photo-electric conversion efficiency. The result also shows that the diameter of the indentations on the surface of the intermediate layer 33 in the foregoing range of 400 nm to 1200 nm is indeed suitable for obtaining desirable photo-electric conversion efficiency.

EXAMPLE 8

The following explains another example of the multi-junction thin-film solar cell of the present invention. Note that, constituting elements having the same functions as those described with reference to the drawing in the foregoing descriptions of the Third Embodiment are given the same reference numerals and explanations thereof are omitted here.

In this example, the irregular patterns on the surface of the intermediate layer 33 are controlled without etching the surface of the intermediate layer 33 but by controlling the height of irregularities of the underlying irregular surface layer 11d. The multi-junction thin-film solar cell 40 was fabricated in the same manner as in Example 7, except that the etching time of the zinc oxide surface of the irregular surface layer 11d was 45 seconds. By this modification, the height of the irregularities of the intermediate layer 33 was expected to be influenced by the higher irregularities of the underlying irregular surface layer 11d.

The amorphous silicon photo-electric conversion layer 32 and the intermediate layer 33 were formed on the solar cell substrate 31 as in Example 7. Observing surface patterns of the intermediate layer 33 using a scanning electron microscope, a large number of indentations of a near hemisphere with the surface diameter of 200 nm to 1400 nm were found.

In order to examine the surface patterns of the intermediate layer 33 in more detail, an atomic force microscope was used to measure the surface patterns. The shape of the indentations on the surface of the intermediate layer 33 in this example was also a near hemisphere or circular cone as in was the case in Example 7, but the root mean square height of the irregularities and tan θ were 28 nm and 0.08, respectively, in this example.

The X-ray diffraction method was performed after forming the crystalline silicon photo-electric conversion layer 34 without etching the surface of the intermediate layer 33. The result showed that the ratio $I_{220}/I_{111}$ of integral intensity $I_{220}$ at the X-ray diffraction peak of 220 to integral intensity $I_{111}$ at the X-ray diffraction peak of 111 was 3.0, which is essentially the same as that obtained in Example 7.

This result indicates that etching of the intermediate layer 33 is not necessarily required to obtain the intermediate layer 33 with irregularities which can exhibit light-trapping effect essentially equivalent to that obtained by the irregular patterns of Example 7.

The current-voltage characteristics of the multi-junction thin-film solar cell 40 were measured under illumination light AM 1.5 (100 mW/cm$^2$). The result showed that the short-circuit current was 13.6 mA/cm$^2$, the open-circuit voltage 1.204 V, the fill factor 0.694, and the photo-electric conversion efficiency 11.36%.

Comparing this result with that of Example 7, it can be seen that the short-circuit current is increased, while the open-circuit voltage and fill factor remain essentially the same. This is probably due to the effect of preventing many defects during the formation of the crystalline silicon photo-electric conversion layer 34, which effect is obtained by the surface configuration of the intermediate layer 33 which is set within a suitable range, together with the light-trapping effect by the irregular surface layer 11d which is provided on the side of the solar cell substrate 31.

This result shows that the shape of the irregularities of the intermediate layer 33 with the root mean square =28 nm and tan θ=0.08 is suitable to obtain higher photo-electric conversion efficiency than that obtained by the irregular patterns of Example 7. The result also shows that the diameter of the indentations on the surface of the intermediate layer 33 in the foregoing range of 200 nm to 1400 nm is indeed suitable for obtaining desirable photo-electric conversion efficiency.

EXAMPLE 9

The following explains yet another example of the multi-junction thin-film solar cell of the present invention. Note that, constituting elements having the same functions as those described with reference to the drawing in the foregoing descriptions of the Third Embodiment are given the same reference numerals and explanations thereof are omitted here.

This example is essentially the same as Example 8 except that the irregular patterns on the surface of the intermediate layer 33 are controlled by etching the surface of the intermediate layer 33. By this modification, the irregularities on the surface of the intermediate layer 33 were expected to be larger than that of Example 7.

The amorphous silicon photo-electric conversion layer 32 and the intermediate layer 33 were formed on the solar cell substrate 31 as in Example 8. However, the thickness of the intermediate layer 33 was set to 50 nm, taking into account the thickness which is lost during etching. Thereafter, the whole was immersed in a 0.5 weight % hydrochloric acid aqueous solution for 15 seconds at the liquid temperature of 25° C., so as to etch the surface of the intermediate layer 33. Observing surface patterns of the intermediate layer 33 using a scanning electron microscope after rinsing the surface thoroughly with pure water, a large number of indentations of a near hemisphere with the surface diameter of 400 nm to 1200 nm were found.

In order to examine the surface patterns of the intermediate layer 33 in more detail, an atomic force microscope was used to measure the surface patterns. The shape of the indentations on the surface of the irregular surface layer in this example was also a near hemisphere or circular cone as in was the case in Example 8, but the root mean square height of the irregularities and tan θ were 40 nm and 0.13, respectively, in this example.

The X-ray diffraction method was performed after forming the crystalline silicon photo-electric conversion layer 34. The result showed that the ratio $I_{220}/I_{111}$ of integral intensity $I_{220}$ at the X-ray diffraction peak of 220 to integral intensity $I_{111}$ at the X-ray diffraction peak of 111 was 2.8, which is essentially the same as that obtained in Example 7.

The current-voltage characteristics of the multi-junction thin-film solar cell 40 were measured under illumination light AM 1.5 (100 mW/cm$^2$). The result showed that the short-circuit current was 14.4 mA/cm$^2$, the open-circuit voltage 1.207 V, the fill factor 0.693, and the photo-electric conversion efficiency 12.05%.

Comparing this result with that of Example 8, it can be seen that the short-circuit current is increased, while the open-circuit voltage and fill factor remain essentially the same. This is probably due to the more suitable irregular patterns which were obtained by etching the surface of the intermediate layer 33.

This result shows that the shape of irregularities of the intermediate layer 33 with the root mean square=40 nm and tan θ=0.13 is suitable to obtain higher photo-electric conversion efficiency than that obtained by the irregular patterns of Example 8. The result also shows that the diameter of the indentations on the surface of the intermediate layer 33 in the foregoing range of 400 nm to 1200 nm as in this Example is indeed suitable for obtaining higher photo-electric conversion efficiency than that of Example 8.

Comparative Example 3

The following explains a comparative example of the thin-film solar cell of the present invention.

In this comparative example, the multi-junction thin-film solar cell was fabricated in the same manner as in Example 7 except that the thickness of the intermediate layer was set at 5 nm without etching. By this modification, the height of the irregularities on the surface of the intermediate layer was expected to be shorter than any of Examples 7 through 9.

Observing surface patterns of the intermediate layer using a scanning electron microscope, a large number of indentations of a near hemisphere with the surface diameter of 50 nm to 200 nm were found.

In order to examine the surface patterns of the intermediate layer in more detail, an atomic force microscope was used to measure the surface patterns. The shape of the indentations on the surface of the intermediate layer in this example was also a near hemisphere or circular cone as in was the case in Example 7, but the root mean square height of the irregularities and tan θ were 14 nm and 0.05, respectively, in this example, and the height of the irregularities was shorter than those of Examples 7 through 9.

The X-ray diffraction method was performed after forming the crystalline silicon photo-electric conversion layer. The result showed that the ratio $I_{220}/I_{111}$ of integral intensity $I_{220}$ at the X-ray diffraction peak of 220 to integral intensity $I_{111}$ at the X-ray diffraction peak of 111 was 3.0, which is essentially the same as that obtained in Example 8.

The current-voltage characteristics of the multi-junction thin-film solar cell were measured under illumination light AM 1.5 (100 mW/cm$^2$). The result showed that the short-circuit current was 10.7 mA/cm$^2$, the open-circuit voltage 1.205 V, the fill factor 0.698, and the photo-electric conversion efficiency 9.00%. Comparing this result with that of Example 7, it can be seen that the short-circuit current is decreased, while the open-circuit voltage and fill factor remain essentially the same. This is probably due to the irregular configuration on the surface of the intermediate layer insufficient to exhibit the light-trapping effect, which resulted from insufficient etching time.

This result shows that the shape of the irregularities of the intermediate layer with the root mean square =14 nm and tan θ=0.05 fails to obtain the irregular surface layer with desirable light-trapping effect. The result also shows that the diameter of the indentations on the surface of the irregular surface layer in the foregoing range of 50 nm to 200 nm fails to obtain the intermediate layer with desirable light-trapping effect.

Thus, from the results of the foregoing Examples 7 through 9, and Comparative Example, it was found that the root mean square height of irregularities in a range of 25 nm to 600 nm, and tan θ in a range of 0.07 to 0.20 are suitable to obtain desirable light-trapping effect.

Thus, it was found that the irregular structure of the intermediate layer of the present invention can be used to fabricate the multi-junction thin-film solar cell with high photo-electric conversion efficiency, without causing severe defects during the formation of the crystalline silicon layer.

Note that, the multi-junction thin-film solar cell may be adapted so that a photo-electric conversion layer which is made up of a plurality of stacked photo-electric conversion elements is provided on the substrate, and the intermediate layer is provided on at least one of the photo-electric conversion elements which are disposed adjacent to one another, wherein the surface of the intermediate layer at least on the other side of the substrate has a root mean square height in a range of 25 nm to 600 nm, and tan θ in a range of 0.07 to 0.20, where θ is the angle of incline.

Further, the multi-junction thin-film solar cell may be adapted so that at least the surface of the intermediate layer on the other side of the substrate is made up of a transparent conductive film.

Further, the multi-junction thin-film solar cell may be adapted so that at least the surface irregularities of the intermediate layer on the other side of the substrate are formed by etching a surface coated with the transparent conductive film.

Further, the multi-junction thin-film solar cell may be adapted so that the irregularities include indentations substantially in the form of a hemisphere or circular cone with a diameter in a range of 200 nm to 2000 nm.

Further, the multi-junction thin-film solar cell may be adapted so that the transparent conductive film chiefly contains zinc oxide.

Further, the multi-junction thin-film solar cell may be adapted so that a photo-electric conversion element whose active layer is made of crystalline silicon or silicon alloy is provided at least on the surface of the intermediate layer on the other side of the substrate.

In this way, a surface of the intermediate layer has a irregular structure with a root mean square height in a range of 25 nm to 600 nm, and tan θ in a range of 0.07 to 0.20, where θ is the angle of incline. This enables the absorbed quantity of light to be increased by the light-trapping effect without causing severe defects in the photo-electric conversion layer, thus providing the multi-junction thin-film solar cell with stable and high photo-electric conversion efficiency at low cost.

The irregularities are preferably made of a transparent conductive material. In this way, incident light is scattered at the interface of the irregularities made of a transparent conductive material, and the photo-electric conversion layer. This increases the optical path length of light and thus light-trapping effect.

It is preferable that the transparent conductive material chiefly contains zinc oxide. In this way, by forming the irregularities with zinc oxide, the product can be provided inexpensively and becomes resistant to modifications due to its high plasma resistance.

It is preferable that the irregularities are formed by etching the transparent conductive material. In this way, by suitably changing types of etchant, or concentration or time of etching, the surface patterns of the transparent conductive material can be easily controlled, thereby easily obtaining irregularities as desired.

In order to achieve the foregoing object of the present invention, another solar cell substrate of the present invention has irregularities on a surface which is in contact with the photo-electric conversion layer, wherein the irregularities partially have indentations substantially in the form of a hemisphere or circular cone with a diameter in a range of 200 nm to 2000 nm. More preferably, the indentations have a diameter in a range of 400 nm to 1200 nm. In this case, the root mean square height of the irregularities falls in a range of 15 nm to 600 nm, and tan θ falls in a range of 0.10 to 0.30, where θ is the angle of incline of the irregular surface with respect to an average line of the irregularities. This arrangement ensures that crystal collisions are prevented. In effect, it is ensured that photo-electric conversion efficiency does not become poor due to defects.

It is preferable that a surface on the other side of the surface in contact with the photo-electric conversion layer has irregularities, and the height of the irregularities is set so that the root mean square height is in a range of 25 nm to 600 nm, and tan θ is in a range of 0.07 to 0.20, where θ is the angle of incline of the irregular surface with respect to an average line of the irregularities.

In this way, the irregularities are suitably provided on the both sides of the photo-electric conversion layer. The effect of this is that light-trapping effect can be sufficiently obtained not only in the middle wavelength range from 450 nm to 650 nm but also in a longer wavelength range of the solar spectrum.

It is preferable that the active layer of at least one of the photo-electric conversion elements of the photo-electric conversion layer is made of crystalline silicon or silicon alloy.

In this way, the light with a wavelength of 700 nm or longer, which cannot be used in the photo-electric conversion by the amorphous silicon, can also be used sufficiently in the photo-electric conversion.

The irregularities are preferably made of a transparent conductive material. In this way, incident light is scattered at the interface of the irregularities made of a transparent conductive material, and the photo-electric conversion layer. This increases the optical path length of light and thus light-trapping effect.

It is preferable that the transparent conductive material chiefly contains zinc oxide. In this way, by forming the irregularities with zinc oxide, the product can be provided inexpensively and becomes resistant to modifications due to its high plasma resistance.

It is preferable that the irregularities are formed by etching the transparent conductive material. In this way, by suitably changing types of etchant, or concentration or time of etching, the surface patterns of the transparent conductive material can be easily controlled, thereby easily obtaining irregularities as desired.

In order to achieve the foregoing object of the present invention, yet another solar cell substrate of the present invention has irregularities on a surface which is in contact with the photo-electric conversion layer, wherein the irregularities partially have indentations substantially in the form of a hemisphere or circular cone with a diameter in a range of 200 nm to 2000 nm. More preferably, the indentations have a diameter in a range of 400 nm to 1200 nm. In this case, the root mean square height of the irregularities falls in a range of 25 nm to 600 nm, and tan θ falls in a range of 0.07 to 0.20, where θ is the angle of incline of the irregular surface with respect to an average line of the irregularities. This arrangement ensures that crystal collisions are prevented. In effect, it is ensured that photo-electric conversion efficiency does not become poor due to defects.

It is preferable that a surface on the other side of the surface in contact with the photo-electric conversion layer has irregularities, and the height of the irregularities is set so that the root mean square height is in a range of 15 nm to 600 nm, and tan θ is in a range of 0.10 to 0.30, where θ is the angle of incline of the irregular surface with respect to an average line of the irregularities.

In this way, the irregularities are suitably provided on the both sides of the photo-electric conversion layer. The effect of this is that light-trapping effect can be sufficiently obtained not only in the middle wavelength range from 450 nm to 650 nm but also in a longer wavelength range of the solar spectrum.

It is preferable that the active layer of at least one of the photo-electric conversion elements of the photo-electric conversion layer is made of crystalline silicon or silicon alloy.

In this way, the light with a wavelength of 700 nm or longer, which cannot be used in the photo-electric conversion by the amorphous silicon, can also be used sufficiently in the photo-electric conversion.

It is preferable that the irregularities are formed both on the front and rear surfaces of the intermediate layer. In this way, the light-trapping effect can be obtained in the two adjacent photo-electric conversion elements on the both sides of the intermediate layer, thereby increasing photo-electric conversion efficiency.

Incidentally, the irregularities of the intermediate layer cause crystal collisions, depending on heights, when crystal directions are different. This causes defects. Such defects become a recombination center of carriers and have detrimental effect on photo-conversion efficiency. Further, the conventional multi-junction thin-film solar cells employ an element structure in which light is incident on the side where the photo-electric conversion element is provided, and the prior art do not provide an element structure in which light is incident on the side of the substrate, which can reduce defects and provide light-trapping effect at the same time.

In view of this, according to the present invention, the height of the irregularities is set so that the root mean square height of the irregularities is in a range of 25 nm to 600 nm, and tan θ is in a range of 0.07 to 0.20, where θ is the angle of incline of the irregular surface with respect to an average line of the irregularities. This arrangement ensures that crystal collisions are prevented. In effect, it is ensured that photo-electric conversion efficiency does not become poor due to defects.

Further, it is preferable that the surface of the substrate on the opposite side of the light incident side has irregularities. In this way, by the two layers of different irregularities, light-trapping effect can be improved more effectively, thus providing the multi-junction thin-film solar cell with high photo-electric conversion efficiency.

The irregularities are preferably made of a transparent conductive material. In this way, incident light is scattered at the interface of the irregularities made of the transparent conductive material, and the photo-electric conversion layer. This increases the optical path length of light and thus light-trapping effect.

It is preferable that the transparent conductive material chiefly contains zinc oxide. In this way, it is possible to provide the multi-junction thin-film solar cell which is inexpensive and has high plasma resistance to resist modifications, compared with the case of using such materials as tin oxide, indium oxide, or ITO (Indium Tin Oxide), which are widely used as the materials of the transparent conductive film.

It is preferable that the irregularities are formed by etching the transparent conductive material. In this way, by suitably changing types of etchant, or concentration or time of etching, the surface patterns of the transparent conductive material can be easily controlled, thereby easily obtaining irregularities as desired.

It is preferable that the transparent conductive film is formed by sputtering. This makes it easier to control transmittance or resistivity of the transparent conductive film to be suitable for the multi-junction thin-film solar cell.

The transparent conductive film has a thickness preferably in a range of 1 nm to 50 nm. The thickness in this range can prevent the problem of non-uniform characteristics, which is caused when the thickness of the transparent conductive film is too thin, and the problem of poor photo-electric conversion efficiency and high cost, which is caused when the thickness is too thick, which lowers transmittance and increases series resistance.

In order to solve the foregoing problems, another multi-junction thin-film solar cell of the present invention includes a plurality of photo-electric conversion elements on the opposite side of a side of a substrate on which light is incident; and an intermediate layer, having irregular surfaces, provided on at least one of the photo-electric conversion elements adjacent to one another, the irregularities of the intermediate layer partially having indentations substantially in the form of a hemisphere or circular cone with a diameter in a range of 200 nm to 2000 nm. More preferably, the indentations have a diameter in a range of 400 nm to 1200 nm.

In this case, the root mean square height of the irregularities falls in a range of 25 nm to 600 nm, and tan θ falls in a range of 0.07 to 0.20, where θ is the angle of incline of the irregular surface with respect to an average line of the irregularities. As a result, it is ensured that crystal collisions are prevented. In effect, it is possible to provide the multi-junction thin-film solar cell (incident light falls on the side of the substrate) having stable and high photo-electric conversion efficiency, which can reduce defects and provide light-trapping effect at the same time.

It is preferable that the active layer of at least one of the photo-electric conversion elements on the surface of the intermediate layer is made of crystalline silicon or silicon alloy.

In this way, the light with a wavelength of 700 nm or longer, which cannot be used in the photo-electric conversion by the amorphous silicon, can also be used sufficiently in the photo-electric conversion, thereby obtaining high photo-electric conversion efficiency and a stable solar cell, capable of suppressing light soaking degradation.

In order to solve the foregoing problems, a solar cell substrate of the present invention has irregularities on a surface which is in contact with a photo-electric conversion layer, light being incident on the solar cell substrate on the side of the irregularities, wherein: a height of the irregularities is set so that a root mean square height is in a range of 20 nm to 400 nm, and tan θ is in a range of 0.15 to 0.25, where θ is an angle of incline of a surface of the irregularities with respect to an average line of the irregularities.

According to this arrangement, it is further ensured that the irregular surface layer 11c with greater light-trapping effect is obtained with less defects in the photo-electric conversion layer.

In order to achieve the foregoing object of the present invention, a solar cell substrate of the present invention has irregularities on a surface which is in contact with a photo-electric conversion layer, light being incident on the solar cell substrate on the other side of the irregularities, wherein: a height of the irregularities is set so that a root mean square height is in a range of 25 nm to 400 nm, and tan θ is in a range of 0.07 to 0.15, where θ is an angle of incline of a surface of the irregularities with respect to an average line of the irregularities.

According to this arrangement, it is further ensured that the irregular surface layer 11d with greater light-trapping effect is obtained with less defects in the photo-electric conversion layer.

In order to achieve the foregoing object of the present invention, a multi-junction thin-film solar cell of the present invention includes: a plurality of photo-electric conversion elements on the opposite side of a side of a substrate on which light is incident; and an intermediate layer, having irregular surfaces, provided on at least one of the photo-electric conversion elements adjacent to one another, a height of the irregularities of the intermediate layer being set so that a root mean square height is in a range of 25 nm to 400 nm, and tan θ in a range of 0.07 to 0.15, where θ is an angle of incline of a surface of the irregularities with respect to an average line of the irregularities.

According to this arrangement, it is further ensured that the intermediate layer 33 with greater light-trapping effect is obtained.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A solar cell substrate having irregularities on a surface which is in contact with a photo-electric conversion layer, light being incident on the solar cell substrate on the side of the irregularities, wherein:
a height of the irregularities is set so that a root mean square height is in a range of 15 nm to 600 nm, and tan θ is in a range of 0.10 to 0.20, where θ is an angle of incline of a surface of the irregularities with respect to an average line of the irregularities.

2. The solar cell substrate as set forth in claim 1, wherein other irregularities are provided above the irregularities.

3. The solar cell substrate as set forth in claim 2, wherein the irregularities are made of a transparent conductive material.

4. The solar cell substrate as set forth in claim 3, wherein the transparent conductive material mainly contains zinc oxide.

5. The solar cell substrate as set forth in claim 4, wherein the irregularities are formed by etching the transparent conductive material.

6. A thin-film solar cell, comprising:

a solar cell substrate having irregularities on a surface being in contact with a photo-electric conversion layer, light being incident on the solar cell substrate on the side of the irregularities, a height of the irregularities being set so that a root mean square height is in a range of 15 nm to 600 nm, and tan θ in a range of 0.10 to 0.20, where θ is an angle of incline of a surface of the irregularities with respect to an average line of the irregularities, said solar cell substrate having the photo-electric conversion layer being made up of at least one photo-electric conversion element.

7. The thin-film solar cell as set forth in claim 6, wherein other irregularities are provided above the irregularities.

8. The thin-film solar cell as set forth in claim 7, wherein a surface opposite the surface in contact with the photo-electric conversion layer has irregularities, and a height of the irregularities of the opposite surface is set so that a root mean square height is in a range of 25 nm to 600 nm, and tan θ in a range of 0.07 to 0.20, where θ is an angle of incline of a surface of the irregularities of the opposite surface with respect to an average line of the irregularities of the opposite surface.

9. The thin-film solar cell as set forth in claim 6, wherein an active layer of at least one photo-electric element of the photo-electric conversion layer is made of crystalline silicon or silicon alloy.

10. A solar cell substrate having irregularities on a surface which is in contact with a photo-electric conversion layer, light being incident on the solar cell substrate on the other side of the irregularities, wherein:
a height of the irregularities is set so that a root mean square height is in a range of 25 nm to 600 nm, and tan θ is in a range of 0.07 to 0.20, where θ is an angle of incline of a surface of the irregularities with respect to an average line of the irregularities.

11. The solar cell substrate as set forth in claim 10, wherein other irregularities are provided above the irregularities.

12. The solar cell substrate as set forth in claim 11, wherein the irregularities are made of a transparent conductive material.

13. The solar cell substrate as set forth in claim 12, wherein the transparent conductive material mainly contains zinc oxide.

14. The solar cell substrate as set forth in claim 13, wherein the irregularities are formed by etching the transparent conductive material.

15. A thin-film solar cell, comprising:
a solar cell substrate having irregularities on a surface being in contact with a photo-electric conversion layer, light being incident on the solar cell substrate on the side of a surface opposite the surface with the irregularities,
a height of the irregularities being set so that a root mean square height is in a range of 25 nm to 600 nm, and tan θ in a range of 0.07 to 0.20, where θ is an angle of incline of a surface of the irregularities with respect to an average line of the irregularities,
said solar cell substrate having the photo-electric conversion layer being made up of at least one photo-electric conversion element.

16. The thin-film solar cell as set forth in claim 15, wherein other irregularities are provided above the irregularities.

17. The thin-film solar cell as set forth in claim 16, wherein a surface opposite the surface in contact with the photo-electric conversion layer has irregularities, and a height of the irregularities of the opposite surface is set so that a root mean square height is in a range of 15 nm to 600 nm, and tan θ in a range of 0.10 to 0.30, where θ is an angle of incline of a surface of the irregularities of the opposite surface with respect to an average line of the irregularities of the opposite surface.

18. The thin-film solar cell as set forth in claim 15, wherein an active layer of at least one photo-electric element of the photo-electric conversion layer is made of crystalline silicon or silicon alloy.

19. A multi-junction thin-film solar cell, comprising:
a plurality of photo-electric conversion elements on the opposite side of a side of a substrate on which light is incident; and
an intermediate layer, having irregular surfaces, provided between at least one of any adjacent pairs of the photo-electric conversion elements,
a height of the irregularities of the intermediate layer being set so that a root mean square height is in a range of 25 nm to 600 nm, and tan θ in a range of 0.07 to 0.20, where θ is an angle of incline of a surface of the irregularities with respect to an average line of the irregularities.

20. The thin-film solar cell as set forth in claim 19, wherein other irregularities are provided above the irregularities.

21. The multi-junction thin-film solar cell as set forth in claim 20, wherein a surface of the substrate opposite the side on which light is incident has irregularities.

22. The multi-junction thin-film solar cell as set forth in claim 19, wherein the irregularities are made of a transparent conductive material.

23. The multi-junction thin-film solar cell as set forth in claim 22, wherein the transparent conductive material mainly contains zinc oxide.

24. The multi-junction thin-film solar cell as set forth in claim 22, wherein the irregularities are formed by etching the transparent conductive material.

25. The multi-junction thin-film solar cell as set forth in claim 22, wherein a transparent conductive film made of the transparent conductive material is formed by a sputtering method.

26. The multi-junction thin-film solar cell as set forth in claim 22, wherein a transparent conductive film made of the transparent conductive material has a thickness in a range of 1 nm to 50 nm.

27. A multi-junction thin-film solar cell, comprising:
a plurality of photo-electric conversion elements on the opposite side of a side of a substrate on which light is incident; and
an intermediate layer, having irregular surfaces, provided between at least one of any adjacent pairs of the photo-electric conversion elements, the irregularities of the intermediate layer partially having indentations in the form of a hemisphere or circular cone with a diameter in a range of 200 nm to 2000 nm.

28. The multi-junction thin-film solar cell as set forth in claim 27, wherein the indentations are in the form of a hemisphere or circular cone with a diameter in a range of 400 nm to 1200 nm.

29. The multi-junction thin-film solar cell as set forth in claim 27, wherein an active layer of at least one of the photo-electric conversion elements on a surface of the intermediate layer is made of crystalline silicon or silicon alloy.

30. A solar cell substrate having irregularities on a surface which is in contact with a photo-electric conversion layer, light being incident on the solar cell substrate on the side of the irregularities,
wherein:
a height of the irregularities is set so that a root mean square height is in a range of 20 nm to 400 nm, and tan θ is in a range of 0.15 to 0.25, where θ is an angle of incline of a surface of the irregularities with respect to an average line of the irregularities.

31. The solar cell substrate as set forth in claim 30, wherein other irregularities are provided above the irregularities.

32. A solar cell substrate having irregularities on a surface which is in contact with a photo-electric conversion layer, light being incident on the solar cell substrate on the other side of the irregularities,
wherein:
a height of the irregularities is set so that a root mean square height is in a range of 25 nm to 400 nm, and tan θ is in a range of 0.07 to 0.15, where θ is an angle of incline of a surface of the irregularities with respect to an average line of the irregularities.

33. The solar cell substrate as set forth in claim 32, wherein other irregularities are provided above the irregularities.

34. A multi-function thin-film solar cell, comprising:
a plurality of photo-electric conversion elements on the opposite side of a side of a substrate on which light is incident; and
an intermediate layer, having irregular surfaces, provided between at least one of any adjacent pairs of the photo-electric conversion elements,
a height of the irregularities of the intermediate layer being set so that a root mean square height is in a range of 25 nm to 400 nm, and tan θ in a range of 0.07 to 0.15, where θ is an angle of incline of a surface of the irregularities with respect to an average line of the irregularities.

35. The solar cell substrate as set forth in claim 34, wherein other irregularities are provided above the irregularities.

* * * * *

UNITED STATES PATENT AND TRADEMARK OFFICE
CERTIFICATE OF CORRECTION

PATENT NO. : 6,787,692 B2
DATED : September 7, 2004
INVENTOR(S) : Kenji Wada et al.

It is certified that error appears in the above-identified patent and that said Letters Patent is hereby corrected as shown below:

<u>Title page,</u>
Item [56], References Cited, insert the following:

U.S. PATENT DOCUMENTS

| | | | | |
|---|---|---|---|---|
| 2001/0035206 | A1 | *11/2001 | Inamasu et al. | 136/255 |
| 6,323,415 | B1 | *11/2001 | Uematsu et al. | 136/246 |
| 6,331,672 | B1 | *12/2001 | Matsuda et al. | 136/256 |

FOREIGN PATENT DOCUMENTS

| | | |
|---|---|---|
| JP | 9-246581 A* | 9/1997 |
| JP | 10-70293 A* | 3/1988 |
| JP | 62-7716 B2 | 2/1987 |
| JP | 10-117006 A | 5/1998 |
| JP | 10-294481 A | 11/1998 |
| JP | 11-214728 A | 8/1999 |
| JP | 11-266027 A | 9/1999 |
| JP | 1-289173 A | 11/1989 |
| JP | 11-233800 A | 8/1999 |
| JP | 2000-58892 | 2/2000 |
| JP | 2-974485 B2 | 9/1999 |
| JP | 3-072832 B2 | 6/2000 |
| WO | 88/09265 A1* | 12/1988 |

UNITED STATES PATENT AND TRADEMARK OFFICE
CERTIFICATE OF CORRECTION

PATENT NO. : 6,787,692 B2
DATED : September 7, 2004
INVENTOR(S) : Kenji Wada et al.

It is certified that error appears in the above-identified patent and that said Letters Patent is hereby corrected as shown below:

Title page (cont'd),

OTHER PUBLICATIONS

Y. Nasuno et al., "Effects of substrates with different surface morphology on microcrystalline silicon solar cells," Electrotechnical Laboratory, SHARP Co., Ltd., page 829, 6a-C-6.

H. Yamamoto et al., "Effects of substrates with different properties on microcrystalline silicon films," Technical Digest of the Int'l PVSEC-11, Hokkaido, Japan, 1999, P231-P232.

Y. Nasuno et al., "Effects of Substrate Surface Morphology on Microcrystalline Silicon Solar Cells," Jpn. J. Appl. Phys. Vol. 40 (2001) pp. L303-L305.*

Y. Nasuno et al., "Microcrystalline Silicon Thin-Film Solar Cells Prepared at Low Temperature Using PECVD," Technical Digest of the Int'l PVSEC-12, Jeju, Korea, 2001, P791-P794.

Y. Nasuno et al., "Microcrystalline Silicon Thin-Film Solar Cells Prepared at Low Temperature Using RF-PECVD," 28th IEEE Photovoltaic Scientists Conference, Anchorage, Alaska, U.S.A., Sep. 22, 2000.*

Y. Nasuno et al., "Microcrystalline Silicon Thin-Film Solar Cells Prepared at Low Temperature," 2001 Materials Research Society Spring Meeting, San Francisco, California, U.S.A., Apr. 9, 2001*.

Signed and Sealed this

Twenty-sixth Day of April, 2005

JON W. DUDAS
*Director of the United States Patent and Trademark Office*